US011930606B2

(12) United States Patent
Ahn et al.

(10) Patent No.: US 11,930,606 B2
(45) Date of Patent: Mar. 12, 2024

(54) DISPLAY DEVICE

(71) Applicant: Samsung Display Co., Ltd., Yongin-si (KR)

(72) Inventors: Sungsang Ahn, Hwaseong-si (KR); Hyun Chul Jeong, Suwon-si (KR); Wonju Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 17/444,746

(22) Filed: Aug. 9, 2021

(65) Prior Publication Data
US 2022/0159847 A1 May 19, 2022

(30) Foreign Application Priority Data
Nov. 13, 2020 (KR) .................. 10-2020-0152055

(51) Int. Cl.
*B32B 3/18* (2006.01)
*B32B 3/04* (2006.01)
*B32B 7/12* (2006.01)
*H05K 5/02* (2006.01)

(52) U.S. Cl.
CPC .......... *H05K 5/0217* (2013.01); *B32B 3/04* (2013.01); *B32B 3/18* (2013.01); *B32B 7/12* (2013.01); *B32B 2457/20* (2013.01)

(58) Field of Classification Search
CPC .................. H04M 1/0268; G06F 1/1652
See application file for complete search history.

(56) References Cited

U.S. PATENT DOCUMENTS

| 10,541,373 | B2 | 1/2020 | Park et al. |
| 2019/0165311 | A1 | 5/2019 | Lee |
| 2021/0120691 | A1* | 4/2021 | Su .................. H04M 1/185 |
| 2022/0413548 | A1* | 12/2022 | Sun .................. G06F 1/1681 |

FOREIGN PATENT DOCUMENTS

| KR | 10-2019-0025799 A | 3/2019 |
| KR | 10-2019-0048825 A | 5/2019 |
| KR | 10-2019-0064183 A | 6/2019 |
| KR | 10-2015126 B1 | 8/2019 |

* cited by examiner

*Primary Examiner* — William P Watkins, III
(74) *Attorney, Agent, or Firm* — Lewis Roca Rothgerber Christie LLP

(57) ABSTRACT

A display device includes: a display module comprising a first non-folding area, a second non-folding area, and a folding area between the first non-folding area and the second non-folding area; a first plate under the display module at the first non-folding area; and a second plate under the display module at the second non-folding area and spaced apart from the first plate, at least one of the first or second plates comprising: a first support layer; a second support layer facing the first support layer; and an encapsulation layer between the first and second support layers along an edge of the first and second support layers and encapsulating a separation space formed between the first and second support layers in a corresponding non-folding area of the first and second non-folding areas.

28 Claims, 21 Drawing Sheets

FIG. 1C
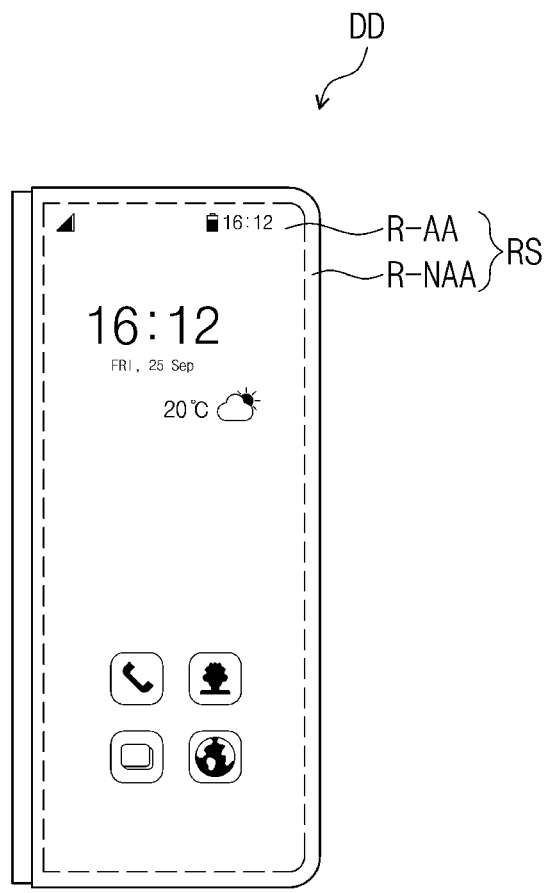
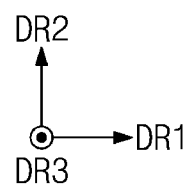

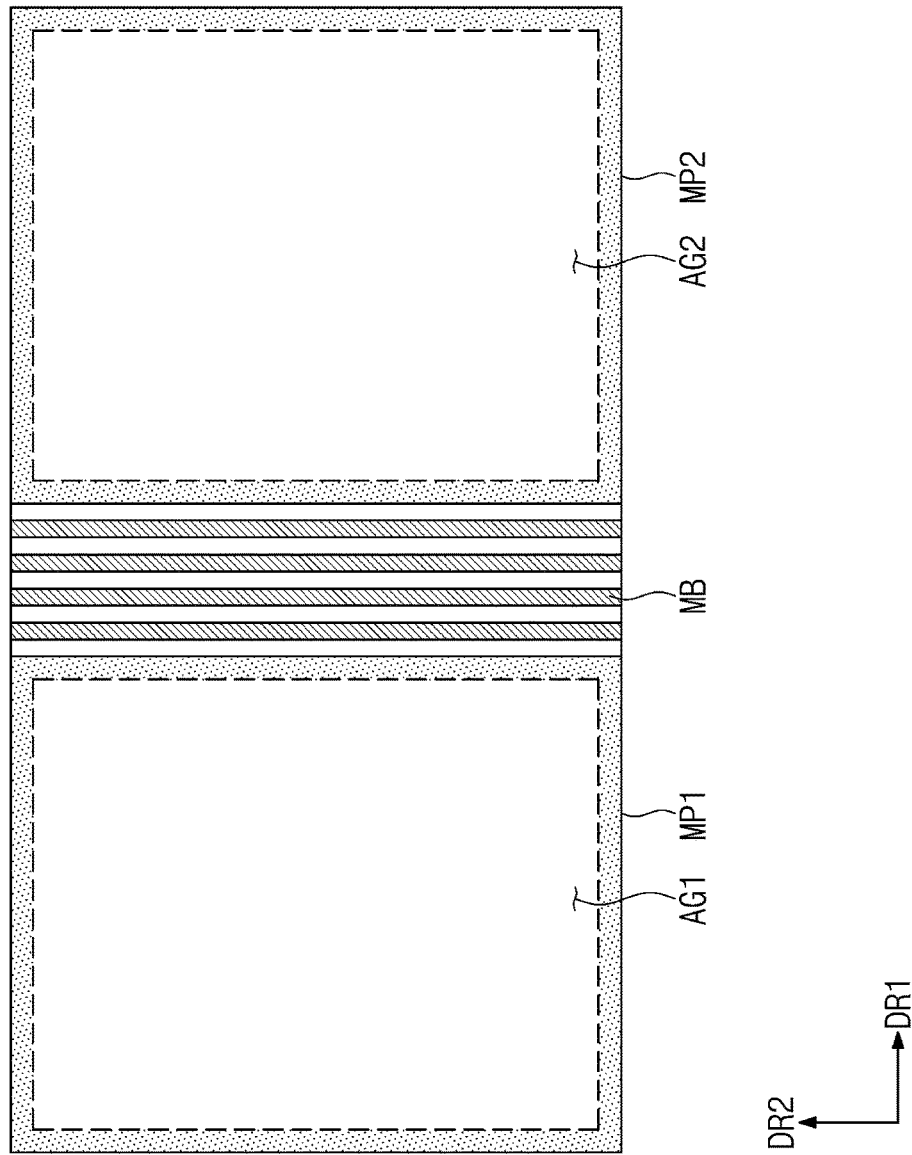

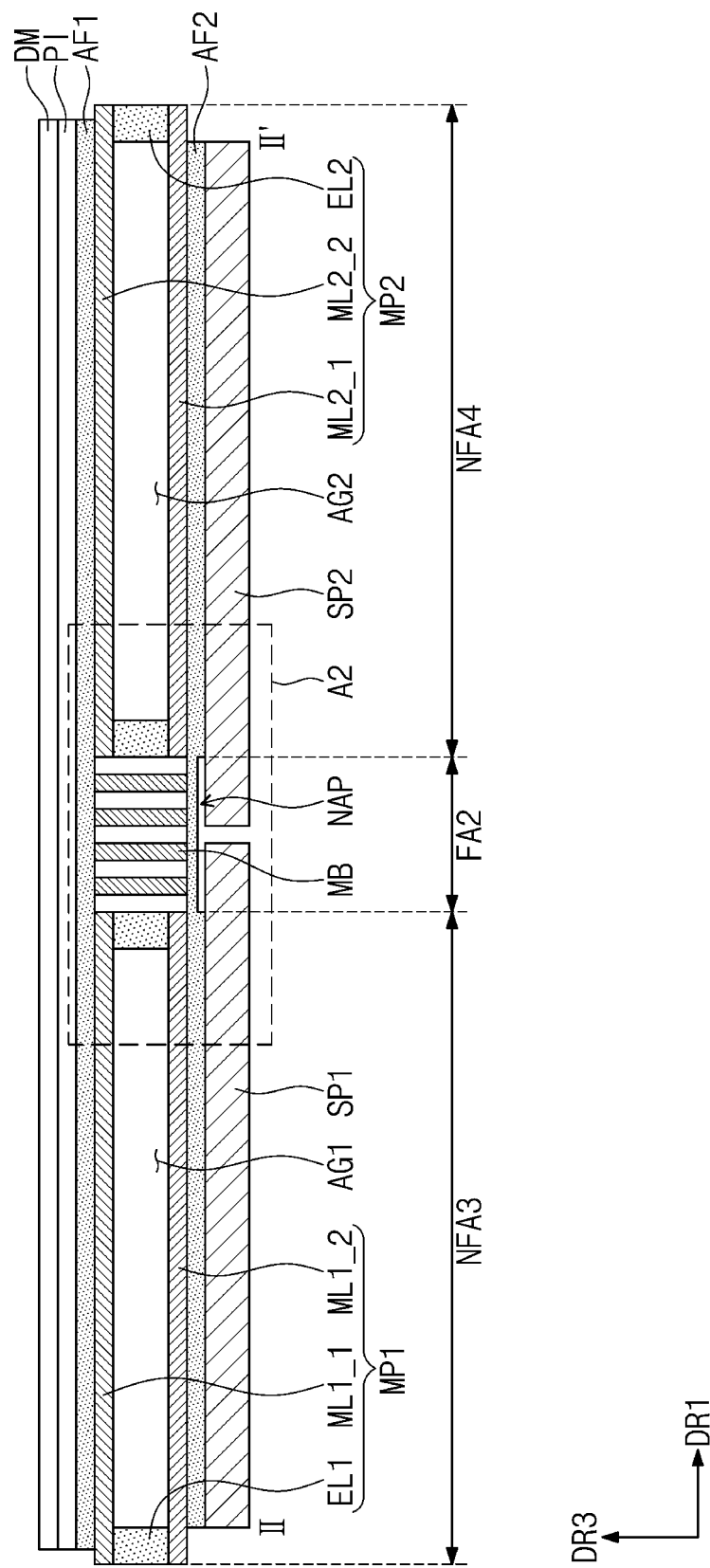

FIG. 15
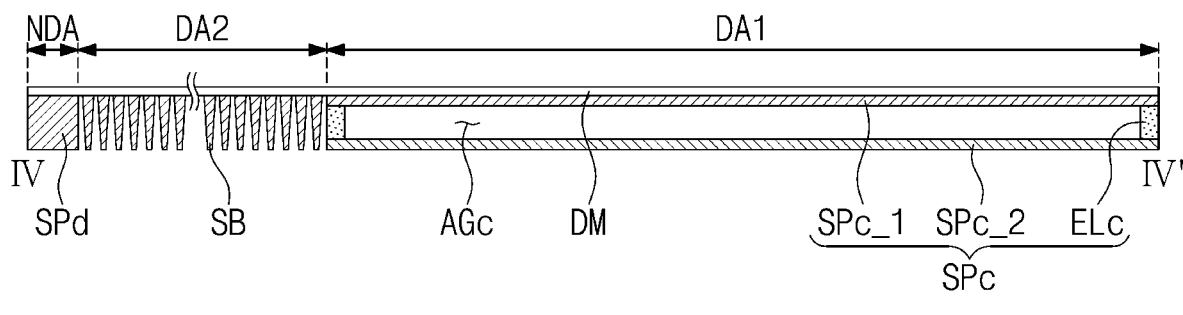
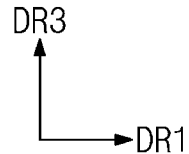

DISPLAY DEVICE

CROSS-REFERENCE TO RELATED APPLICATION

The present application claims priority to and the benefit of Korean Patent Application No. 10-2020-0152055, filed on Nov. 13, 2020, the content of which is hereby incorporated by reference in its entirety.

BACKGROUND

1. Field

Aspects of some embodiments of the present disclosure relate to a display device.

2. Description of the Related Art

A display device displays a variety of images through a display screen to provide a user with graphical information. In recent years, flexible display devices including a flexible display panel that is foldable are being developed. In contrast to rigid display devices, flexible display devices may be folded, rolled, or bent without damaging the flexible display device. Because the shape of the flexible display device may be changed in various ways, it may be more convenient for users to carry the flexible display device.

The above information disclosed in this Background section is only for enhancement of understanding of the background and therefore the information discussed in this Background section does not necessarily constitute prior art.

SUMMARY

Aspects of some embodiments of the present disclosure relate to a display device. For example, the present disclosure relates to a flexible display device having relatively improved impact resistance.

Aspects of some embodiments of the present disclosure include a display device having relatively improved impact resistance.

Aspects of some embodiments of the inventive concept include a display device including a display module, a first plate, and a second plate. The display module includes a first non-folding area, a second non-folding area, and a folding area located between the first non-folding area and the second non-folding area. The first plate is located under the display module to correspond to the first non-folding area, and the second plate is located under the display module to correspond to the second non-folding area and spaced apart from the first plate.

According to some embodiments, at least one of the first or second plates includes a first support layer, a second support layer facing the first support layer, and an encapsulation layer interposed between the first and second support layers along an edge of the first and second support layers. The encapsulation layer encapsulates a separation space formed between the first and second support layers in a corresponding non-folding area of the first and second non-folding areas.

Aspects of some embodiments of the inventive concept include a display device including a display module, an upper plate, a first support plate, and a second support plate. The display module includes a first non-folding area, a second non-folding area, and a folding area located between the first non-folding area and the second non-folding area. The upper plate includes a bending portion through which a plurality of opening patterns is defined to overlap the folding area. The first support plate is located under the upper plate to correspond to the first non-folding area, and the second support plate is located under the upper plate to correspond to the second non-folding area and arranged to be spaced apart from the first support plate.

According to some embodiments, at least one of the first or second support plates includes a first support layer, a second support layer facing the first support layer, and an encapsulation layer interposed between the first and second support layers along an edge of the first and second support layers. The encapsulation layer encapsulates a separation space formed between the first and second support layers in a corresponding non-folding area of the first and second non-folding areas.

Aspects of some embodiments of the inventive concept include a display device including a display module in which a bending area and a non-bending area are defined and a support plate located under the display module.

According to some embodiments, the support plate includes a first support layer arranged to correspond to the non-bending area, a second support layer facing the first support layer, and an encapsulation layer interposed between the first and second support layers along an edge of the first and second support layers. The encapsulation layer encapsulates a separation space formed between the first and second support layers to correspond to the non-bending area.

According to some embodiments, at least one of the first or second plates and the first and second support plates includes the first and second layers facing each other with an air gap interposed therebetween and the encapsulation layer encapsulating the air gap. Thus, impacts applied thereto from the outside are absorbed by the air gap, and the impact resistance of the display device is improved.

BRIEF DESCRIPTION OF THE DRAWINGS

The above and other aspects of some embodiments of the present disclosure will become more apparent by reference to the following detailed description when considered in conjunction with the accompanying drawings wherein:

FIG. 1C is a plan view showing a display device in an in-folded state according to some embodiments of the present disclosure;

FIG. 4 is a plan view showing first and second plates shown in FIG. 3 according to some embodiments of the present disclosure;

FIG. 7A is a cross-sectional view taken along a line II-II' shown in FIG. 6 to show a display device in a first state according to some embodiments of the present disclosure;

FIG. 15 is a cross-sectional view taken along a line IV-IV' shown in FIG. 14 according to some embodiments of the present disclosure.

DETAILED DESCRIPTION

Figure 1A:
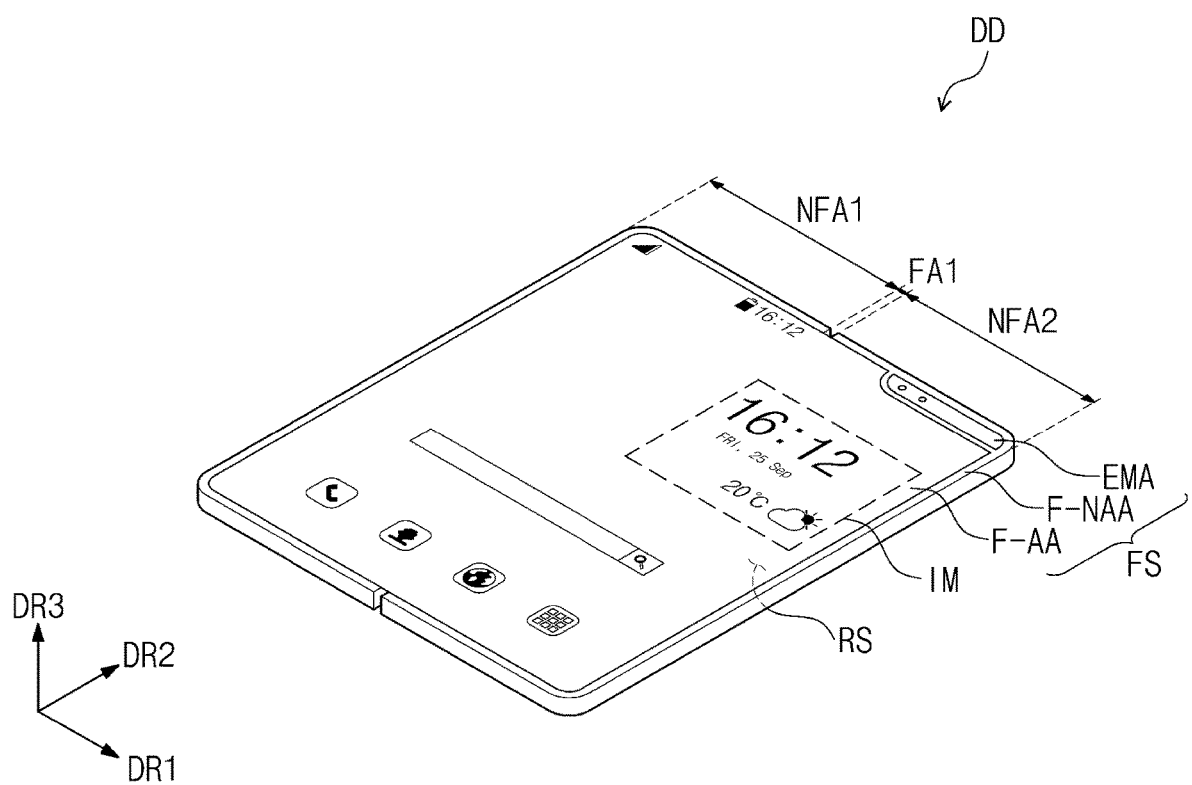
FIG. 1A is a perspective view showing a display device in an unfolded state according to some embodiments of the present disclosure.

In the present disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like numerals refer to like elements throughout. The thickness and the ratio and the dimension of the element are exaggerated for effective description of the technical contents. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. The terminology used herein is for the purpose of describing particular embodiments only and is not intended to be limiting of the invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be further understood that the terms "may include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 1B:
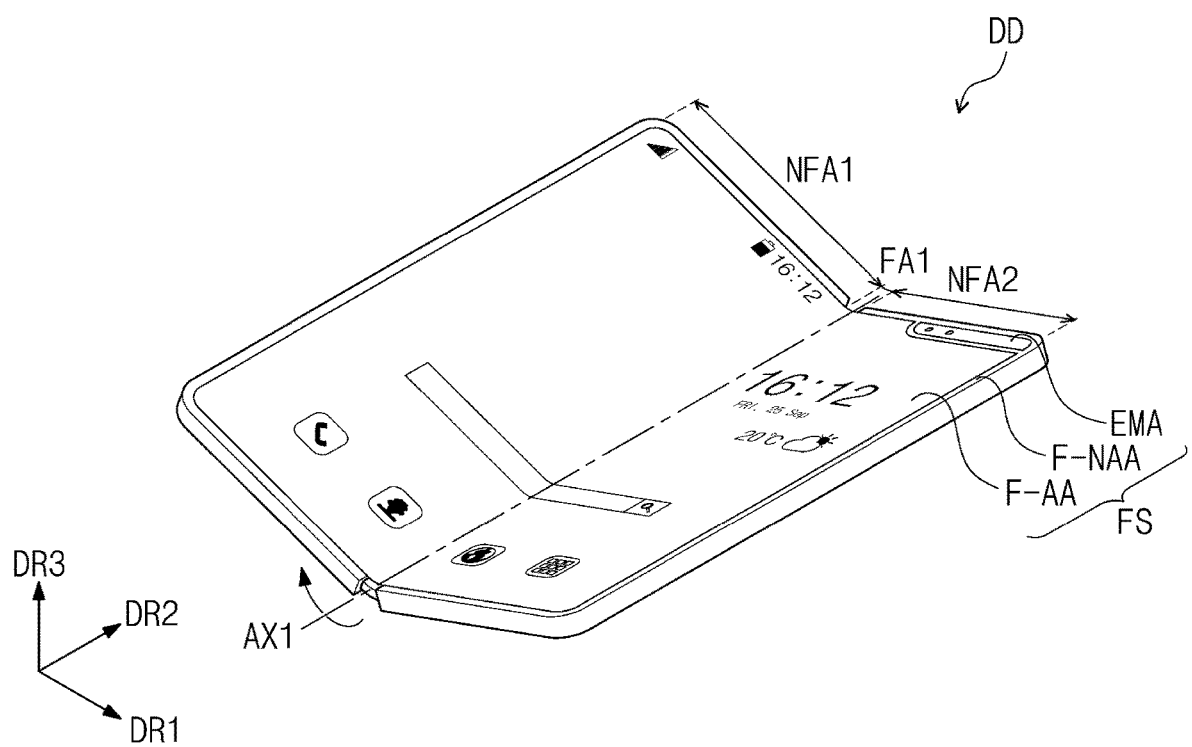
FIG. 1B is a perspective view showing the display device shown in FIG. 1A in the midst of an in-folding process according to some embodiments of the present disclosure.
Figure 1D:
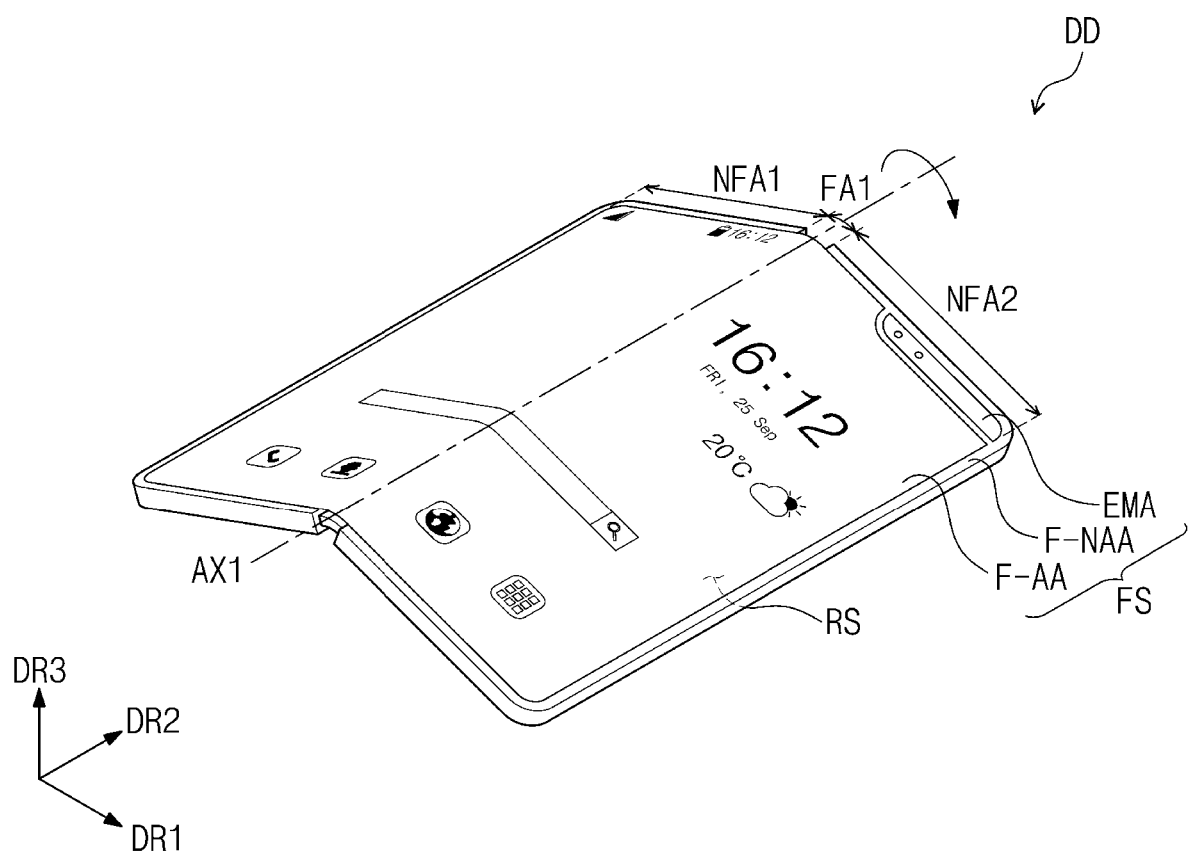
FIG. 1D is a perspective view showing a display device in the midst of an out-folding process according to some embodiments of the present disclosure.

FIG. 1A is a perspective view showing a display device DD in an unfolded state according to some embodiments of the present disclosure. FIG. 1B is a perspective view showing the display device DD shown in FIG. 1A in the middle of an in-folding process (e.g., in a partially folded state). FIG. 1C is a plan view showing the display device DD in an in-folded state according to some embodiments of the present disclosure. FIG. 1D is a perspective view showing the display device DD in the midst of an out-folding process of according to some embodiments of the present disclosure.

Referring to FIG. 1A, the display device DD may be a device that is activated in response to an electrical signal. The display device DD may include various embodiments. For example, the display device DD may include a tablet computer, a notebook computer, a computer, a smart television, and the like. According to some embodiments, a foldable smartphone will be described as a representative example of the display device DD.

The display device DD may display an image IM at a first display surface FS, which is substantially parallel to each of a first direction DR1 and a second direction DR2, toward a third direction DR3. The first display surface FS through which the image IM is displayed may correspond to a front surface of the display device DD. The image IM may include a still image as well as a video. FIG. 1A shows an internet search box and a clock widget as a representative example of the image IM.

According to some embodiments, front (or upper) and rear (or lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3.

A separation distance in the third direction DR3 between the front surface and the rear surface may correspond to a thickness or a height of the display device DD in the third direction DR3. Meanwhile, directions indicated by the first, second, and third directions DR1, DR2, and DR3 are relative to each other and may be changed to other directions.

The display device DD may sense an external input applied thereto from the outside. The external input may include inputs of various forms provided from the outside of the display device DD. For example, the external input may include external inputs in proximity to or approaching close to the display device DD at a distance (e.g., a set or predetermined distance) (e.g., a hovering input) as well as a touch input by a user's body, e.g., a hand of a user. In addition, the external input may include various forms, such as force, pressure, temperature, or light.

The display device DD according to some embodiments may include the first display surface FS and a second display surface RS. The first display surface FS may include a first active area F-AA, a first peripheral area F-NAA, and an electronic module area EMA. The second display surface RS may be opposite to at least a portion of the first display surface FS. That is, the second display surface RS may be defined as a portion of the rear surface of the display device DD.

The first active area F-AA may be activated in response to the electrical signal. The image IM may be displayed at the first active area F-AA, and various external inputs may be sensed through the first active area F-AA. The first peripheral area F-NAA may be defined adjacent to the first active area F-AA. The first peripheral area F-NAA may have a color (e.g., a set or predetermined color). The first peripheral area F-NAA may surround the first active area F-AA. Accordingly, the first active area F-AA may have a shape that is substantially defined by the first peripheral area F-NAA, however, this is merely one example. The first peripheral area F-NAA may be defined adjacent to only one side of the first active area F-AA or may be omitted. The display device DD according to some embodiments may include active areas of various shapes and should not be particularly limited.

Various electronic modules may be located in the electronic module area EMA. For example, the electronic module may include at least one of a camera, a speaker, an optical sensor, or a thermal sensor, although embodiments according to the present disclosure are not limited thereto. For example, the display device DD may include any suitable electronic component (e.g., sensors, signal receivers, signal emitters, etc.) as an electronic module according to the design of the display device DD. The electronic module area EMA may sense an external subject through the first and second display surfaces FS and RS or may provide a sound signal, such as a voice, to the outside through the first and second display surfaces FS and RS. In addition, the electronic module may include a plurality of components, however, it should not be limited to a particular embodiment.

The electronic module area EMA may be surrounded by the first active area F-AA and the first peripheral area F-NAA, however, it should not be limited thereto or thereby. The electronic module area EMA may be defined in the first active area F-AA, and the electronic module area EMA should not be particularly limited.

The display device DD according to some embodiments may include at least one folding area FA1 and a plurality of non-folding areas NFA1 and NFA2 extending from the folding area FA1. The non-folding areas NFA1 and NFA2 may be spaced apart from each other with the folding area FA1 interposed therebetween.

Referring to FIG. 1B, the display device DD may include a folding axis AX1 that is imaginary and extends in the second direction DR2. The folding axis AX1 may extend in the second direction DR2 on the first display surface FS. That is, the folding axis AX1 may extend along a major axis of the display device DD.

According to some embodiments, the non-folding areas NFA1 and NFA2 may be located adjacent to the folding area FA1 with the folding area FA1 interposed therebetween. For example, a first non-folding area NFA1 may be located adjacent to one side of the folding area FA1 in the first direction DR1, and a second non-folding area NFA2 may be located adjacent to the other side of the folding area FA1 in the first direction DR1.

The display device DD may be folded about the folding axis AX1 to be in an in-folding state where one area of the first display surface FS, which overlaps the first non-folding area NFA1, faces the other area of the first display surface FS, which overlaps the second non-folding area NFA2.

Referring to FIG. 1C, the second display surface RS may be viewed by a user during the in-folding state of the display device DD. In this case, the second display surface RS may include a second active area R-AA through which the image is displayed and a second peripheral area R-NAA adjacent to the second active area R-AA. The second active area R-AA may be activated in response to electrical signals. The second active area R-AA may be an area through which the image is displayed and various external inputs are sensed. The second peripheral area R-NAA may have a color (e.g., a set or predetermined color). The second peripheral area R-NAA may surround the second active area R-AA. In addition, according to some embodiments, the second display surface RS may further include an electronic module area in which an electronic module including various components is located, and the second display surface RS should not be particularly limited.

Referring to FIG. 1D, the display device DD may be folded about the folding axis AX1 to be in an out-folding state where one area of the second display surface RS, which overlaps the first non-folding area NFA1, faces the other area of the second display surface RS, which overlaps the second non-folding area NFA2.

However, the display device DD should not be limited thereto or thereby. The display device DD may be folded about a plurality of folding axes such that a portion of the first display surface FS and a portion of the second display surface RS may face each other, and the number of the folding axes and the number of non-folding areas should not be particularly limited. For example, according to some embodiments, the display device DD may include two or more folding axes.

Figure 2A:
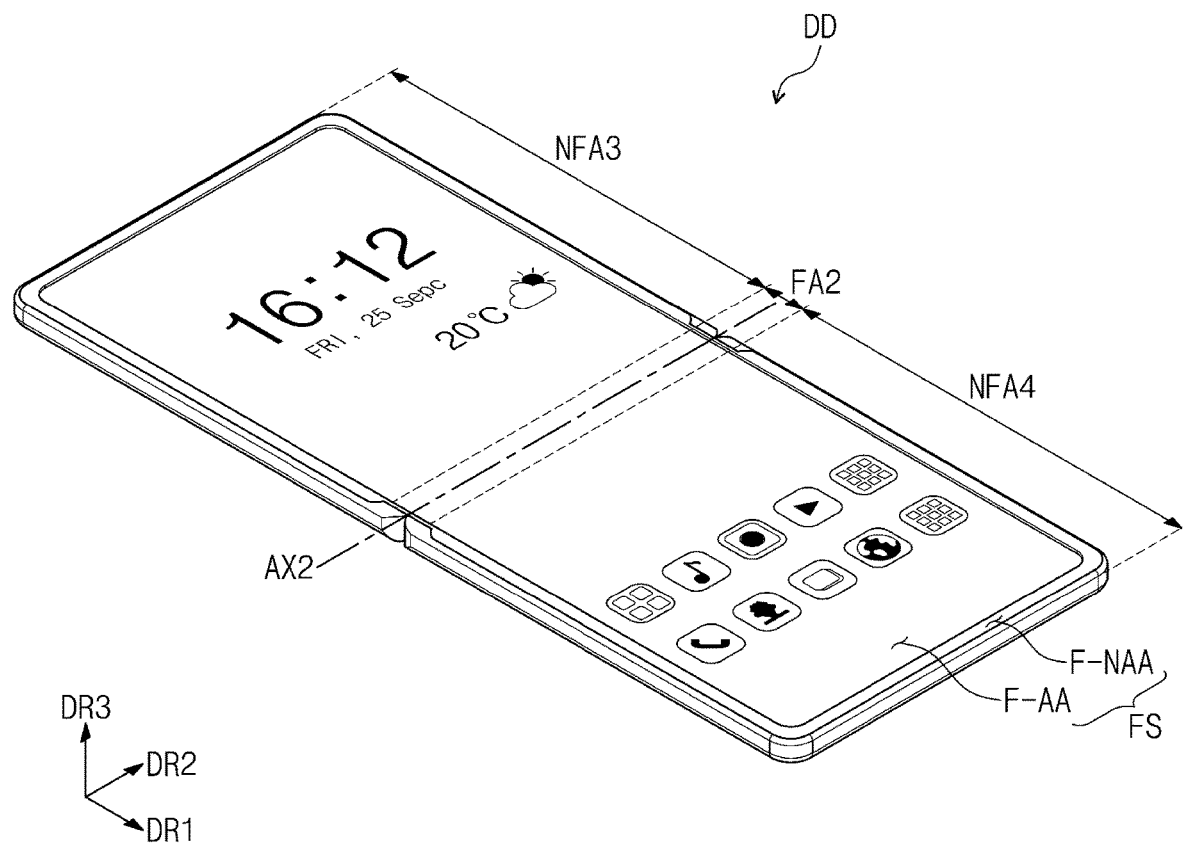
FIG. 2A is a perspective view showing a display device in an unfolded state according to some embodiments of the present disclosure.
Figure 2B:
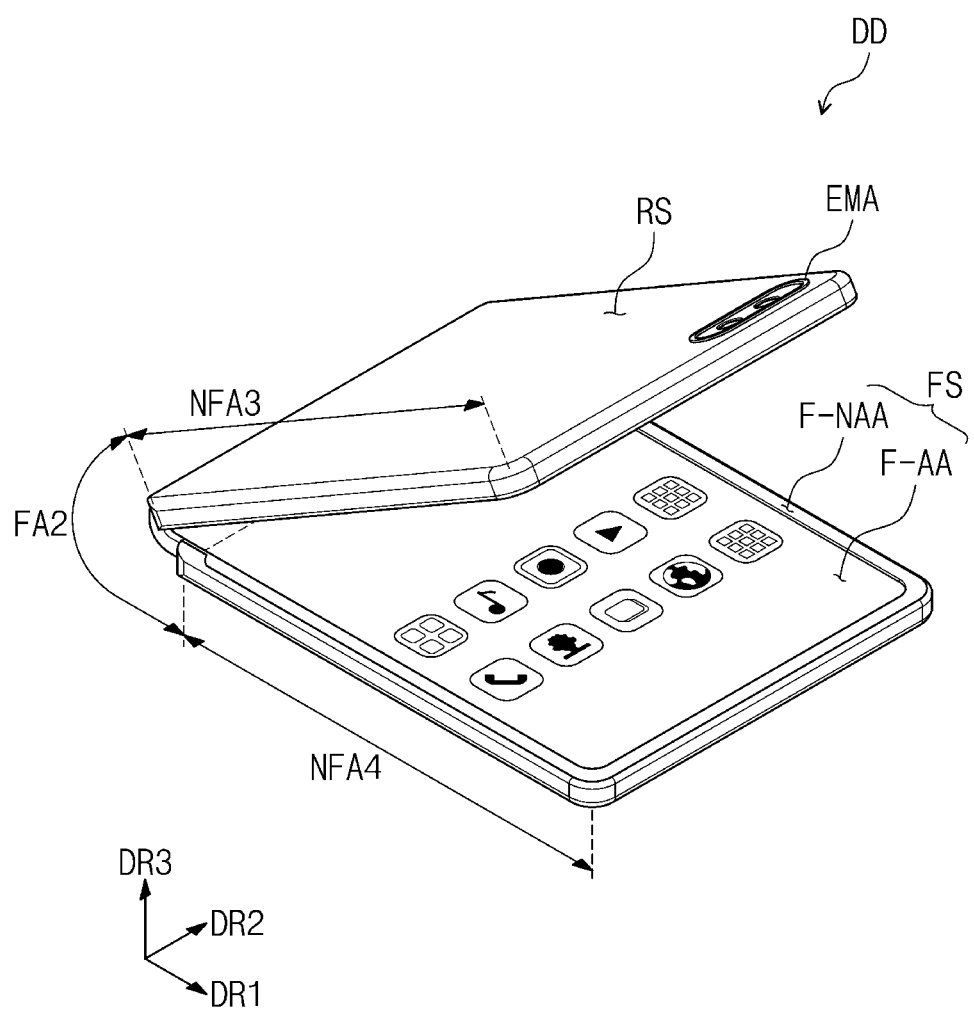
FIG. 2B is a perspective view showing the display device shown in FIG. 2A in the midst of an in-folding process according to some embodiments of the present disclosure.

FIG. 2A is a perspective view showing a display device DD in an unfolded state according to some embodiments of the present disclosure, and FIG. 2B is a perspective view showing the display device shown in FIG. 2A in the midst of an in-folding process.

Referring to FIGS. 2A and 2B, the display device DD may be inwardly or outwardly folded (in-folding or out-folding) about a folding axis AX2. The folding axis AX2 may extend in the second direction DR2. In FIGS. 1A to 1D, the folding axis AX1 extends along the major axis of the display device DD, however, the folding axis AX2 may extend along a minor axis of the display device DD as shown in FIGS. 2A and 2B.

A plurality of areas may be defined in the display device DD according to an operation type of the display device DD. The areas may include a folding area FA2 and at least one non-folding area NFA3 and NFA4. The folding area FA2 may be defined between two non-folding areas NFA3 and NFA4.

The folding area FA2 may be an area folded about the folding axis AX2 and substantially forming a curvature. As an example, the non-folding areas NFA3 and NFA4 may include a first non-folding area NFA3 and a second non-folding area NFA4. The first non-folding area NFA3 may be adjacent to one side of the folding area FA2 in the first direction DR1, and the second non-folding area NFA4 may be adjacent to the other side of the folding area FA2 in the first direction DR1.

According to some embodiments, the display device DD includes one folding area FA2 defined therein, however, embodiments according to the present disclosure are not limited thereto or thereby. According to some embodiments, the display device DD may include a plurality of folding areas defined therein.

In the non-folding state of the display device DD, a first display surface FS may be viewed by the user, and in the in-folding state, a second display surface RS may be viewed by the user. The second display surface RS may include an electronic module area EMA in which an electronic module including various components is located.

Figure 3:
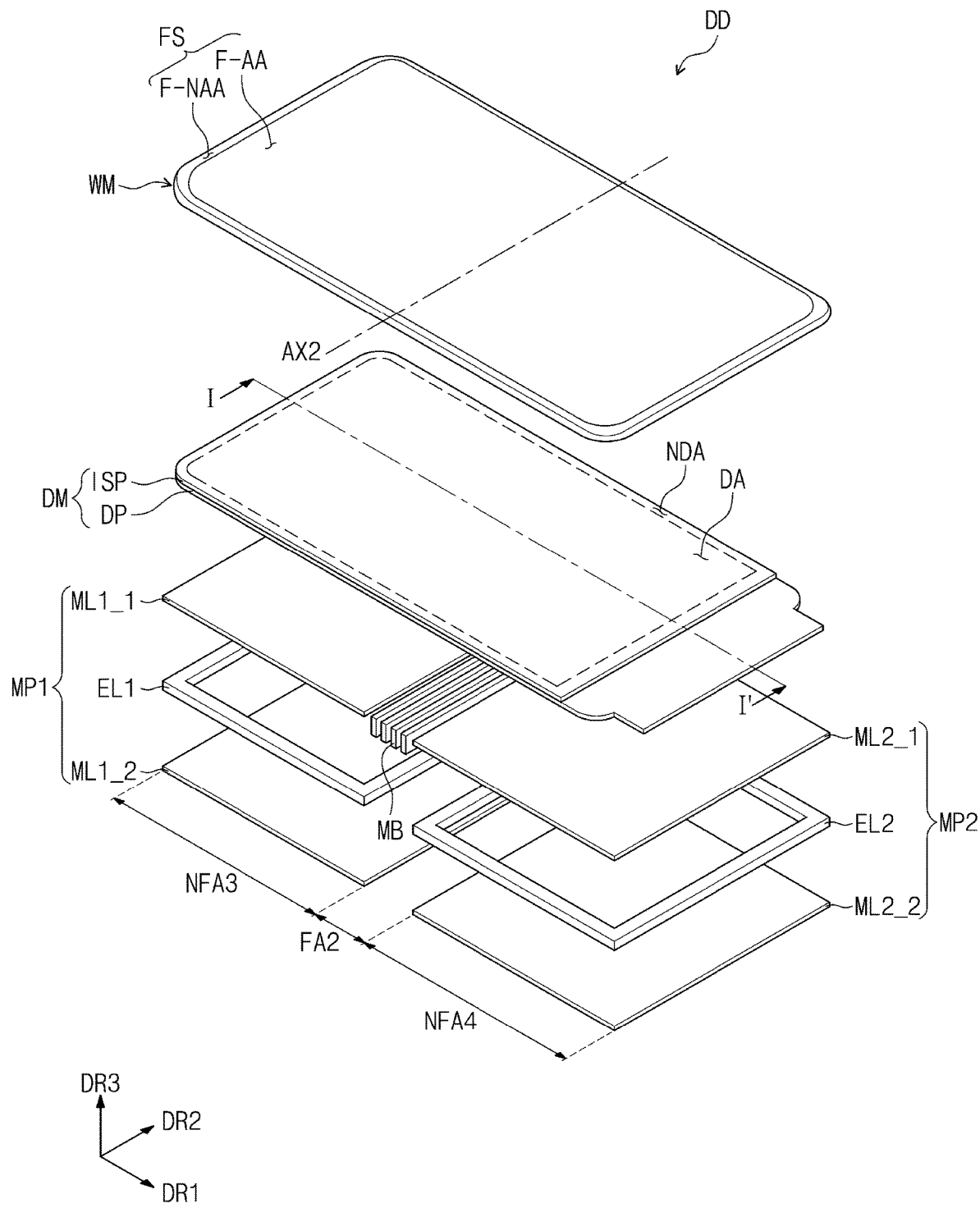
FIG. 3 is an exploded perspective view showing a display device according to some embodiments of the present disclosure.
Figure 5A:
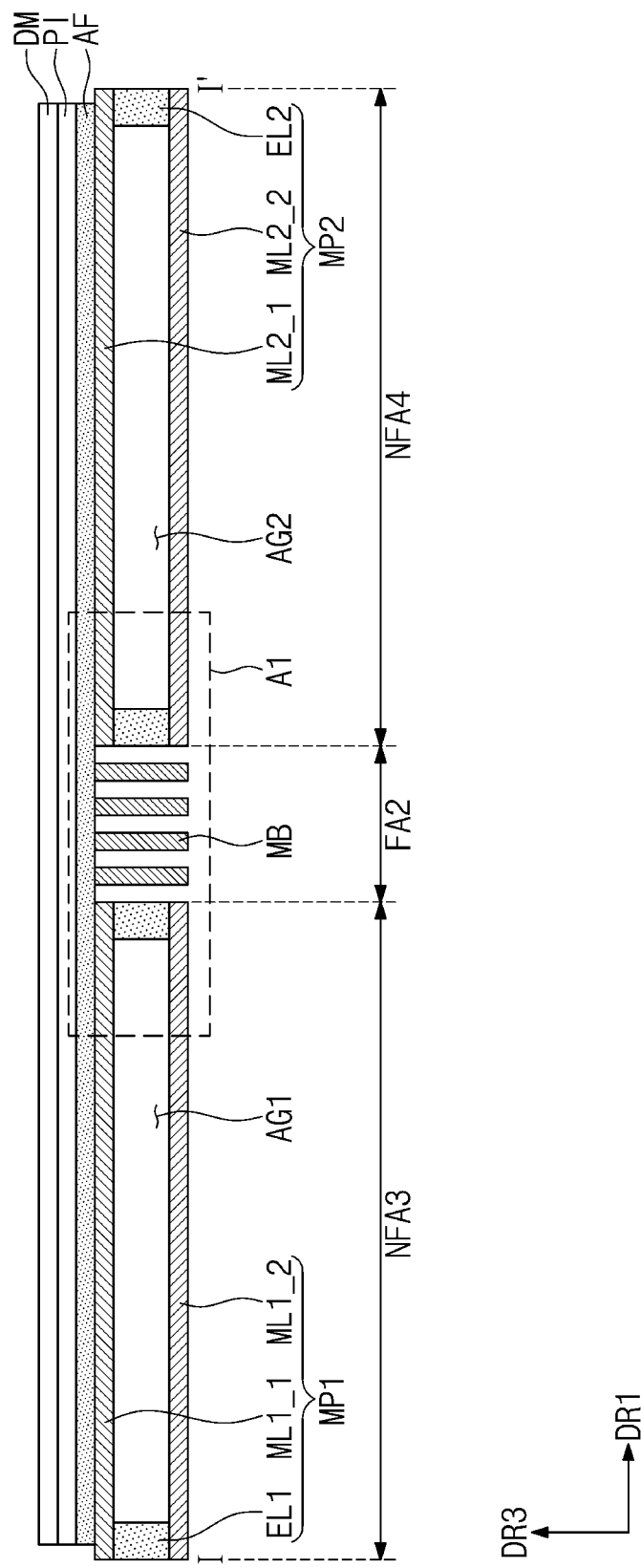
FIG. 5A is a cross-sectional view taken along a line I-I' shown in FIG. 3 according to some embodiments of the present disclosure.
Figure 5B:
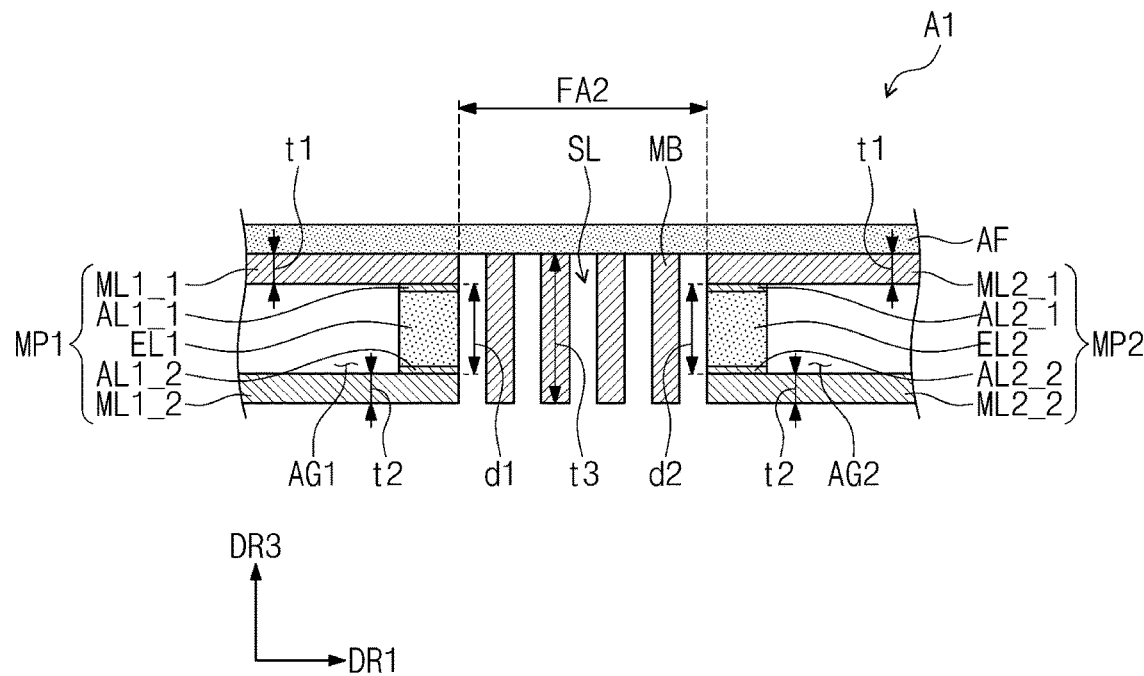
FIGS. 5B and 5C are enlarged views showing a portion A1 shown in FIG. 5A according to some embodiments of the present disclosure.
Figure 5C:
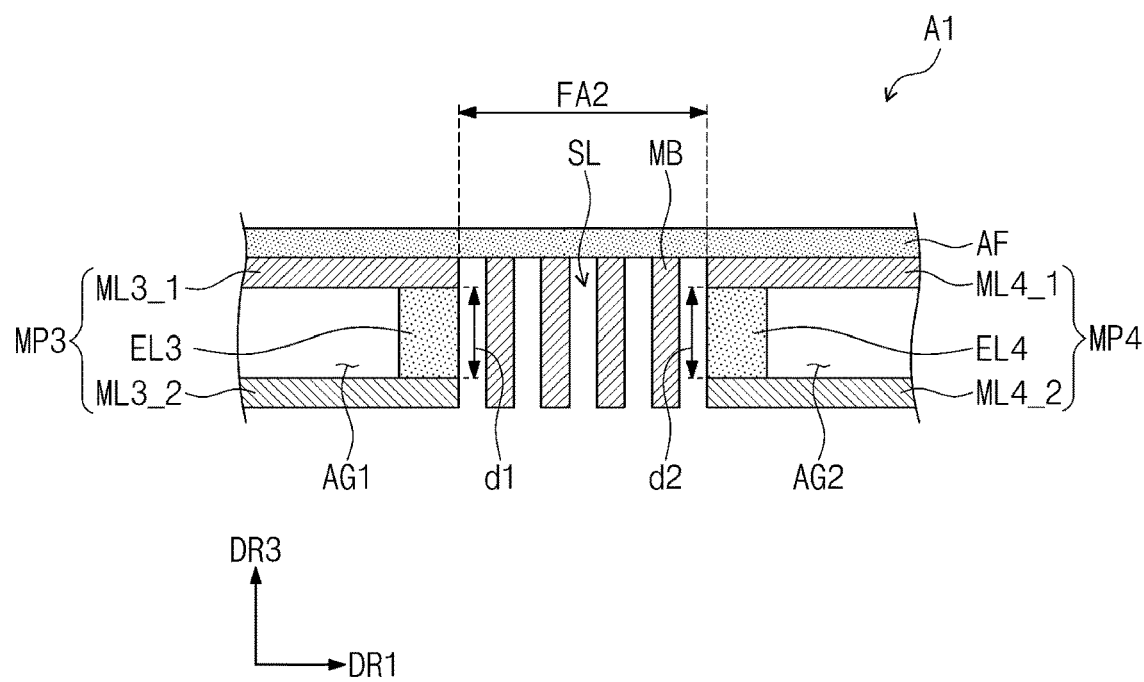

FIG. 3 is an exploded perspective view showing the display device DD according to some embodiments of the present disclosure, and FIG. 4 is a plan view showing first and second plates MP1 and MP2 shown in FIG. 3. FIG. 5A is a cross-sectional view taken along a line I-I' shown in FIG. 3, and FIGS. 5B and 5C are enlarged views showing a portion A1 shown in FIG. 5A.

Referring to FIGS. 3 to 5B, the display device DD may include a display module DM displaying images, an upper module located on the display module DM, and a lower module located under the display module DM. The display module DM may form a portion of the display device DD, and for example, the images may be generated by the display module DM.

The display module DM may include a display panel DP and an input sensing unit ISP. The display panel DP may be a light emitting type display panel, however, embodiments according to the present disclosure are not limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, for convenience of explanation, the display panel DP will be described as being an organic light emitting display panel.

The display panel DP may be a flexible display panel. Accordingly, the display panel DP may be rolled completely or may be folded or unfolded about the folding axis AX2.

The input sensing unit ISP may be arranged directly on the display panel DP. According to some embodiments, the input sensing unit ISP may be formed on the display panel DP through successive processes. That is, when the input sensing unit ISP is located directly on the display panel DP, no adhesive film may be formed or utilized between the input sensing unit ISP and the display panel DP, however, embodiments according to the present disclosure are not limited thereto or thereby. The adhesive film may be located between the input sensing unit ISP and the display panel DP. In this case, the input sensing unit ISP is not manufactured with the display panel DP through the successive processes. That is, the input sensing unit ISP may be fixed to an upper surface of the display panel DP by the adhesive film after being manufactured through separate processes from the display panel DP.

The display panel DP may generate images, and the input sensing unit ISP may obtain coordinate information on a user's input, e.g., a touch event.

The upper module may include a window WM located on the display module DM. The window WM may include an optically transparent insulating material. Therefore, the image generated by the display module DM may be easily viewed by the user through the window WM.

For example, the window WM may include a thin glass or a synthetic resin film. The window WM may include a flexible material. Accordingly, the window WM may be folded or unfolded about the folding axis AX2. That is, a shape of the window WM may be changed when a shape of the display module DM is changed.

The window WM may transmit the image from the display module DM and substantially simultaneously buffer external impacts to prevent the display module DM from being damaged or from malfunctioning due to the external impacts. The external impacts indicate external force represented by pressure or stress, which causes defects in the display module DM.

The display module DM may display the image in response to electrical signals and may transmit/receive information about the external input. The display module DM may include a display area DA and a non-display area NDA. The display area DA may be defined as an area through which images provided from the display module DM transmits.

The non-display area NDA may be defined adjacent to the display area DA. For example, the non-display area NDA may surround the display area DA. However, this is merely one example, and the non-display area NDA may be defined in various shapes and should not be particularly limited. According to some embodiments, the display area DA of the display module DM may correspond to at least a portion of a first active area F-AA.

The lower module may include a first plate MP1 and a second plate MP2 which are located on a rear surface of the display module DM to support the display module DM. Each of the first and second plates MP1 and MP2 may have a plate shape. As an example, the first plate MP1 may be formed in the plate shape having a size corresponding to the first non-folding area NFA3, and the second plate MP2 may be formed in the plate shape having a size corresponding to the second non-folding area NFA4.

The first plate MP1 may include a first support layer ML1_1, a second support layer ML1_2, and a first encapsulation layer EL1. The first support layer ML1_1 may include a metal material. As an example, the first support layer ML1_1 may include stainless steel, aluminum, or alloys thereof. The second support layer ML1_2 may include the same material as that of the first support layer ML1_1. As an example, the second support layer ML1_2 may include stainless steel, aluminum, or alloys thereof. According to some embodiments, the second support layer ML1_2 may include a material different from that of the first support layer ML1_1. For example, when the first support layer ML1_1 includes aluminum, the second support layer ML1_2 may include stainless steel. As another example, the second support layer ML1_2 may include a plastic material.

As an example, the first and second support layers ML1_1 and ML1_2 may have substantially the same rigidity as each other. In this case, the first and second support layers ML1_1 and ML1_2 may include the same material as each other, and the first and second support layers ML1_1 and ML1_2 may have the same thickness. According to some embodiments, the first and second support layers ML1_1 and ML1_2 may have different rigidities from each other. In this case, the first and second support layers ML1_1 and ML1_2 may include the same material as or different materials from each other. In the case where the first and second support layers ML1_1 and ML1_2 include the same material, the thickness of the second support layer ML1_2 may be smaller than the thickness of the first support layer ML1_1. According to some embodiments, the second support layer ML1_2 may include a material having a rigidity lower than that of the first support layer ML1_1. In this case, for example, the first support layer ML1_1 may include a metal material, and the second support layer ML1_2 may include a plastic material.

Each of the first and second support layers ML1_1 and ML1_2 may have the plate shape substantially parallel to a plane defined by the first direction DR1 and the second direction DR2 crossing the first direction DR1. The first and second support layers ML1_1 and ML1_2 may be arranged to face each other in the third direction DR3. The first encapsulation layer EL1 may be interposed between the first and second support layers ML1_1 and ML1_2 along an edge of the first and second support layers ML1_1 and ML1_2. The first encapsulation layer EL1 may have a closed-loop shape. Accordingly, the first encapsulation layer EL1 may encapsulate a first separation space AG1 formed between the first and second support layers ML1_1 and ML1_2 to correspond to the first non-folding area NFA3.

The first encapsulation layer EU may include at least one of polyethylene terephthalate (PET), polyimide (PI), polyamide (PAI), polyethylene naphthalate (PEN), or polycarbonate (PC). However, the first encapsulation layer EL1 should not be limited to the above-mentioned materials. According to some embodiments, the first encapsulation layer EL1 may include the same material as that of one of the first and second support layers ML1_1 and ML1_2.

As shown in FIG. 5B, the first plate MP1 may further include a first adhesive layer AL1_1 and a second adhesive layer AL1_2. The first adhesive layer AL1_1 may be located between the first encapsulation layer EL1 and the first support layer ML1_1, and the second adhesive layer AL1_2 may be located between the first encapsulation layer EU and the second support layer ML1_2. Each of the first and second adhesive layers AL1_1 and AL1_2 may be a double-sided adhesive tape. Accordingly, the first support layer ML1_1, the first encapsulation layer EL1, and the second support layer ML1_2 may be coupled to each other by the first and second adhesive layers AL1_1 and AL1_2.

The first separation space AG1 may be filled with air. Accordingly, an air gap may be formed between the first and second support layers ML1_1 and ML1_2. The air gap formed between the first and second support layers ML1_1 and ML1_2 may absorb the external impact applied thereto. Accordingly, an impact resistance of the display device DD may be improved.

The impact resistance may be confirmed through a point impact test or a surface impact test. The point impact corresponds to an impact applied to the display device DD when a pointed device, such as a pen, is dropped from an arbitrary height. The surface impact refers to an impact applied by a device such as a ball, and the surface impact test measures how much impact load the display device DD has absorbed when the ball of a size (e.g., a set or predetermined size) and weight is dropped.

The point impact test was performed under the same condition on a first structure in which no air gap exists in the first and second plates MP1 and MP2 and a second structure in which air gaps AG1 and AG2 exist in the first and second plates MP1 and MP2, i.e., structures shown in FIGS. 3 to 5C. The results show that the first structure absorbed impacts applied thereto from up to about 2 cm in height while the second structure absorbed impacts applied thereto from up to about 8 cm in height. That is, it is observed that the impact resistance of the display device DD is improved when the first and second plates MP1 and MP2 include the air gaps AG1 and AG2, respectively.

As an example, the first separation space AG1 defined by the first support layer ML1_1, the first encapsulation layer EL1, and the second support layer ML1_2 may not be filled with other materials other than air or no separate structure may be placed in the first separation space AG1. When the first separation space AG1 is filled with only air, impacts applied thereto from up to about 8 cm in height is absorbed, however, when the first separation space AG1 is filled with other materials other than air or a separate structure is placed in the first separation space AG1, impacts applied thereto from up to about 6.7 cm in height is absorbed. That is, when the first separation space AG1 is filled with only air, the impact resistance of the display device DD may be improved.

The second plate MP2 may be arranged to be spaced apart from the first plate MP1 by a distance (e.g., a set or predetermined distance) in the first direction DR1. That is, the first plate MP1 and the second plate MP2 may be spaced apart from each other with the folding area FA2 interposed therebetween.

The second plate MP2 may include a third support layer ML2_1, a fourth support layer ML2_2, and a second encapsulation layer EL2. The third support layer ML2_1 may include a metal material. As an example, the third support layer ML2_1 may include stainless steel, aluminum, or alloys thereof. The fourth support layer ML2_2 may include the same material as that of the third support layer ML2_1. As an example, the fourth support layer ML2_2 may include stainless steel, aluminum, or alloys thereof. According to some embodiments, the fourth support layer ML2_2 may include a material different from that of the third support layer ML2_1. For example, in the case where the third support layer ML2_1 includes aluminum, the fourth support layer ML2_2 may include stainless steel. As another example of the present disclosure, the fourth support layer ML2_2 may include a plastic material.

As an example, the first and third support layers ML1_1 and ML2_1 may have the same rigidity as each other, and the second and fourth support layers ML1_2 and ML2_2 may have the same rigidity as each other. In this case, the first and third support layers ML1_1 and ML2_1 may include the same material as each other, and the second and fourth support layers ML1_2 and ML2_2 may include the same material as each other.

Each of the third and fourth support layers ML2_1 and ML2_2 may have a plate shape substantially parallel to a plane defined by the first direction DR1 and the second direction DR2 crossing the first direction DR1. The third and fourth support layers ML2_1 and ML2_2 may be arranged to face each other in the third direction DR3. The second encapsulation layer EL2 may be interposed between the third and fourth support layers ML2_1 and ML2_2 along an edge of the third and fourth support layers ML2_1 and ML2_2. The second encapsulation layer EL2 may have a closed-loop shape. Accordingly, the second encapsulation layer EL2 may encapsulate a second separation space AG2 formed between the third and fourth support layers ML2_1 and ML2_2 to correspond to the second non-folding area NFA4.

The second encapsulation layer EL2 may include at least one of polyethylene terephthalate (PET), polyimide (PI), polyamide (PAI), polyethylene naphthalate (PEN), or polycarbonate (PC). However, the second encapsulation layer EL2 should not be limited to the above-mentioned materials. According to some embodiments, the second encapsulation layer EL2 may include the same material as that of one of the third and fourth support layers ML2_1 and ML2_2. The first and second encapsulation layers EL1 and EL2 may include the same material as each other and may have the same thickness as each other.

The second plate MP2 may further include a third adhesive layer AL2_1 and a fourth adhesive layer AL2_2. The third adhesive layer AL2_1 may be located between the second encapsulation layer EL2 and the third support layer ML2_1, and the fourth adhesive layer AL2_2 may be located between the second encapsulation layer EL2 and the fourth support layer ML2_2. Each of the third and fourth adhesive layers AL2_1 and AL2_2 may be a double-sided adhesive tape. Accordingly, the third support layer ML2_1, the second encapsulation layer EL2, and the fourth support layer ML2_2 may be coupled to each other by the third and fourth adhesive layers AL2_1 and AL2_2.

The second separation space AG2 may be filled with air. Accordingly, an air gap may be formed between the third and fourth support layers ML2_1 and ML2_2. The air gap formed between the third and fourth support layers ML2_1 and ML2_2 may absorb the external impact applied thereto. Therefore, the impact resistance of the display device DD may be improved. As an example, the second separation space AG2 may not be filled with other materials other than air or no separate structure may be placed in the second separation space AG2.

The lower module may further include a plurality of support bars MB located between the first and second plates MP1 and MP2. That is, the support bars MB may be arranged to correspond to the folding area FA2. Each of the support bars MB may have a bar shape extending in the second direction DR2 along the folding axis AX2.

The support bars MB may be arranged along the first direction DR1 in the folding area FA2 to be spaced apart from each other with a distance (e.g., a set or predetermined distance). The support bars MB may be spaced apart from each other by a plurality of slit patterns SL. Each of the support bars MB may have a quadrangular shape in a cross-section when viewed, however, the shape in the cross-section of the support bars MB should not be limited thereto or thereby. As an example, each of the support bars MB may have a trapezoidal or triangular cross section. The support bars MB may support the display module DM in the folding area FA2 and may allow the display device DD to be easily folded.

Referring to FIG. 5B, each of the first and third support layers ML1_1 and ML2_1 may have a first thickness t1 in the third direction DR3, and each of the second and fourth support layers ML1_2 and ML2_2 may have a second thickness t2 in the third direction DR3. As an example, when each of the first and third support layers ML1_1 and ML2_1 includes aluminum, the first thickness t1 may be within a range from about 30 μm to about 60 μm, and when each of the first and third support layers ML1_1 and ML2_1 includes stainless steel, the first thickness t1 may be within a range from about 10 μm to about 40 μm. The second thickness t2 may be equal to or different from the first thickness t1. As an example, the second thickness t2 may be equal to or smaller than the first thickness t1.

The first and second support layers ML1_1 and ML1_2 may be spaced apart from each other with a first distance d1 in the third direction DR3, and the third and fourth support layers ML2_1 and ML2_2 may be spaced apart from each other with a second distance d2 in the third direction DR3. The first and second distances d1 and d2 may be the same as each other. Each of first and second distances d1 and d2 may be changed depending on the material and the thickness of each of the first and third support layers ML1_1 and ML2_1. For example, when each of the first and third support layers ML1_1 and ML2_1 includes aluminum, the first thickness t1 may be within a range from about 30 μm to about 60 μm, and each of the first and second distances d1 and d2 may be within a range from about 150 μm to about 400 μm. In addition, when each of the first and third support layers ML1_1 and ML2_1 includes stainless steel, the first thickness t1 may be within a range from about 10 μm to about 40 μm, and each of the first and second distances d1 and d2 may be within a range from about 200 μm from about 600 μm.

Each of the support bars MB may have a third thickness t3 in the third direction DR3. The third thickness t3 may be greater than the first and second thicknesses t1 and t2. As an example, the third thickness t3 may be greater than a sum of the first and second thicknesses t1 and t2. For example, the third thickness t3 may be equal to a value obtained by adding the first distance d1 to the sum of the first and second thicknesses t1 and t2.

The support bars MB may include the same material as one of the first and second support layers ML1_1 and ML1_2. When the support bars MB include the same material as the first support layer ML1_1, the support bars MB may include a metal material, such as stainless steel, aluminum, or alloys thereof.

As another example of the present disclosure, first and second plates MP3 and MP4 having different structures from those of the first and second plates MP1 and MP2 of FIG. 5B are shown in FIG. 5C. Referring to FIG. 5C, the first plate MP3 may include a first support layer ML3_1, a second support layer ML3_2, and a first encapsulation layer EL3. The second plate MP4 may include a third support layer ML4_1, a fourth support layer ML4_2, and a second encapsulation layer EL4. The first and second support layers ML3_1 and ML3_2 may have the same structure as that of the first and second support layers ML1_1 and ML1_2 shown in FIG. 5B, and the third and fourth support layers ML4_1 and ML4_2 may have the same structure as that of the third and fourth support layers ML2_1 and ML2_2 shown in FIG. 5B.

Each of the first and second encapsulation layers EL3 and EL4 may include a material with an adhesive property. Accordingly, the first and second support layers ML3_1 and ML3_2 may be coupled with each other by the first encapsulation layer EL3 without using a separate adhesive member, e.g., the first and second adhesive layers AL1_1 and AL1_2 (refer to FIG. 5B). In addition, the third and fourth support layers ML4_1 and ML4_2 may also be coupled with each other by the second encapsulation layer EL4 without a separate adhesive member, e.g., the third and fourth adhesive layers AL2_1 and AL2_2 (refer to FIG. 5B). As an example, each of the first and second encapsulation layers EL3 and EL4 may include a pressure sensitive adhesive (PSA), an optical clear adhesive (OCA), or an optical clear resin (OCR). However, the material of each of the first and second encapsulation layers EL3 and EL4 should not be particularly limited. In addition, each of the first and second encapsulation layers EL3 and EL4 may have an elasticity higher than that of the first, second, third, and fourth support layers ML3_1, ML3_2, ML4_1, and ML4_2.

As shown in FIG. 5C, each of the first and second support layers ML3_1 and ML3_2 is directly coupled with the first encapsulation layer EL3, and each of the third and fourth support layers ML4_1 and ML4_2 is directly coupled with the second encapsulation layer EL4. In this case, a first distance d1 in the third direction DR3 between the first and second support layers ML3_1 and ML3_2 may be the same as a thickness in the third direction DR3 of the first encapsulation layer EL3. In addition, a second distance d2 in the third direction DR3 between the third and fourth support layers ML4_1 and ML4_2 may be the same as a thickness in the third direction DR3 of the second encapsulation layer EL4.

Referring to FIGS. 5A and 5B again, the lower module may further include an adhesive film AF located between the first and second plates MP1 and MP2 and the display module DM. The adhesive film AF may be a double-sided adhesive film. The adhesive film AF may include an optically transparent adhesive material. As an example, the adhesive film AF may include a pressure sensitive adhesive (PSA), an optical clear adhesive (OCA), or an optical clear resin (OCR).

The first plate MP1 may be attached to one side surface of the adhesive film AF to correspond to the first non-folding area NFA3, and the second plate MP2 may be attached to the one side surface of the adhesive film AF to correspond to the second non-folding area NFA4. The support bars MB may be attached to the one side surface of the adhesive film AF to correspond to the folding area FA2.

The lower module may further include a protective film PI between the display module DM and the adhesive film AF. The protective film PI may be located under the display module DM and may protect a rear surface of the display module DM. The protective film PI may include a synthetic resin film, e.g., a polyimide film or a polyethylene terephthalate film, however, the protective film PI should not be limited thereto or thereby. The protective film PI may be coupled with the first and second plates MP1 and MP2 and the support bars MB by the adhesive film AF. In addition, the adhesive film may be further located between the protective film PI and the display module DM. Accordingly, the protective film PI may be attached to the rear surface of the display module DM by the adhesive film.

Figure 6:
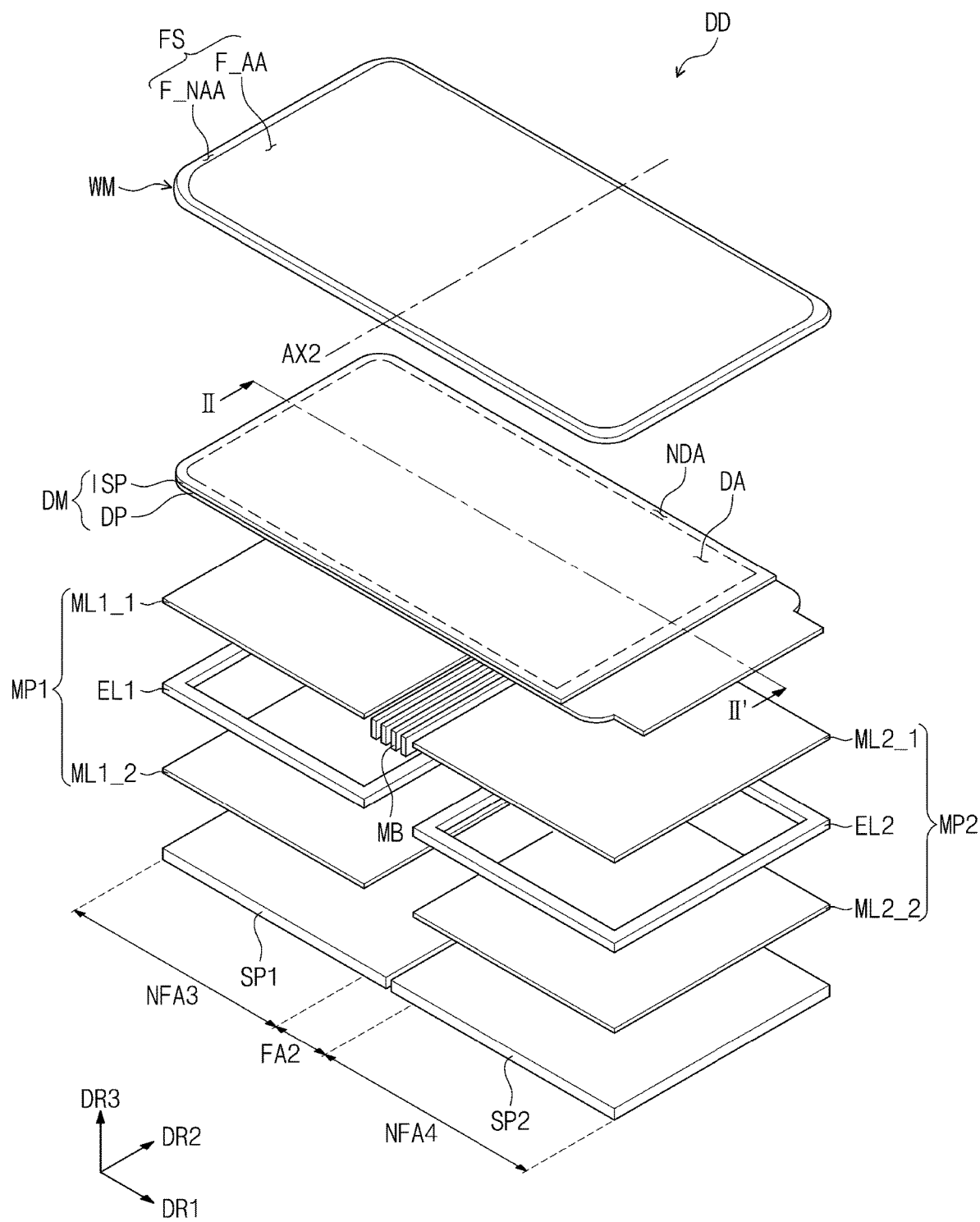
FIG. 6 is an exploded perspective view showing a display device according to some embodiments of the present disclosure.
Figure 7B:
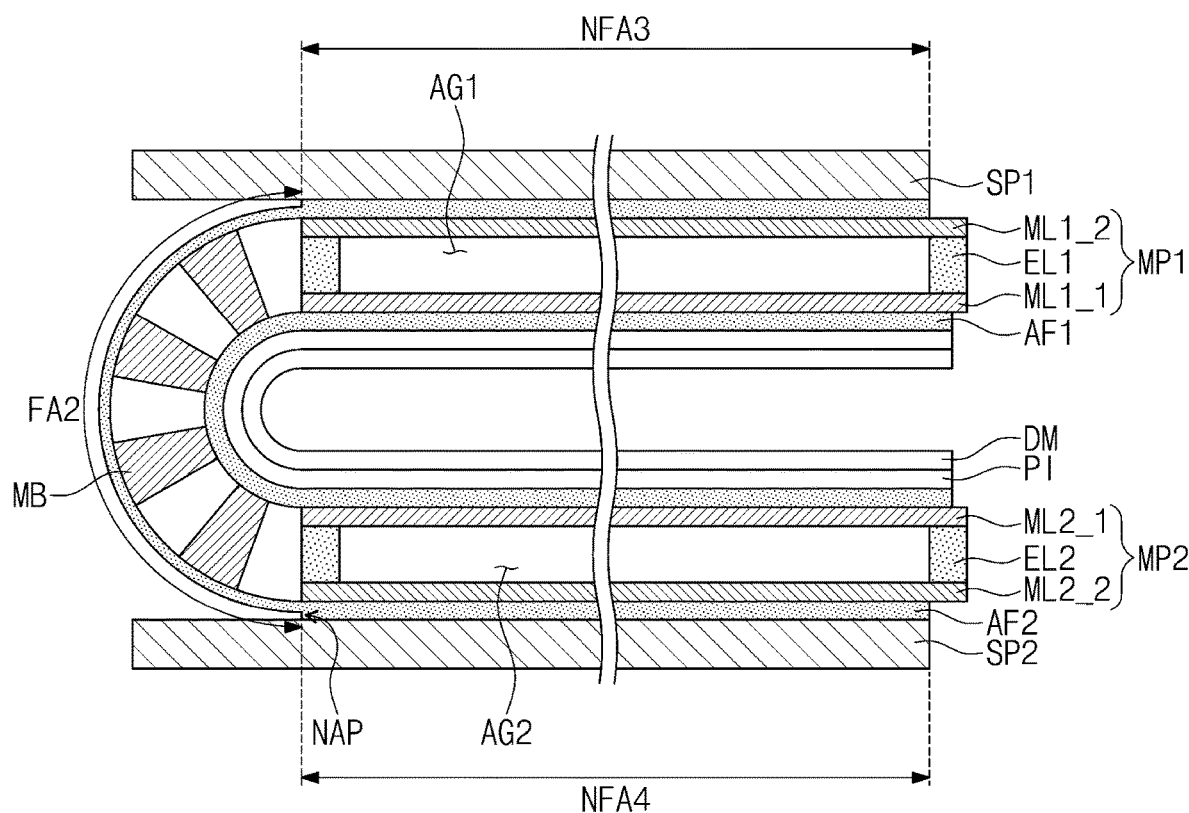
FIG. 7B is a cross-sectional view showing the display device shown in FIG. 7A in a second state according to some embodiments of the present disclosure.
Figure 8:
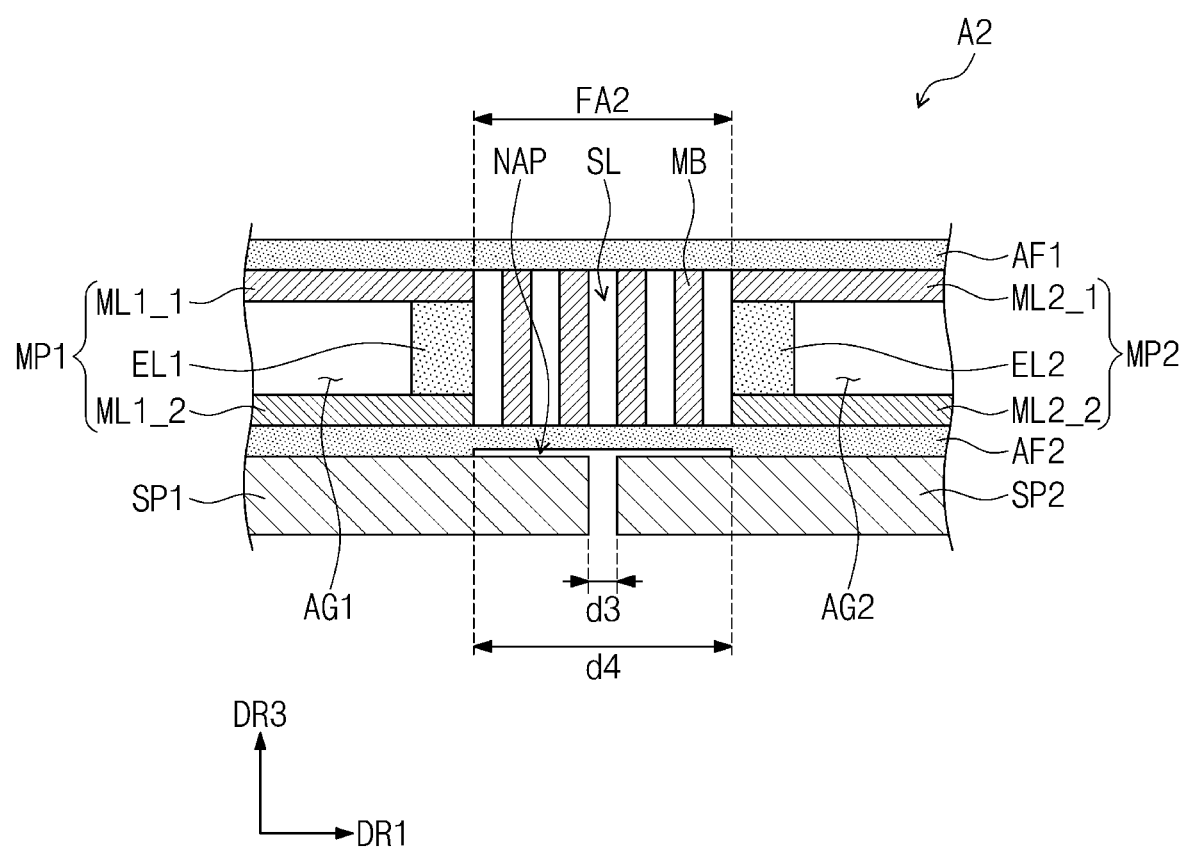
FIG. 8 is an enlarged cross-sectional view showing a portion A2 shown in FIG. 7A according to some embodiments of the present disclosure.

FIG. 6 is an exploded perspective view showing a display device DD according to some embodiments of the present disclosure. FIG. 7A is a cross-sectional view taken along a line II-II' shown in FIG. 6 to show the display device DD in a first state, and FIG. 7B is a cross-sectional view showing the display device DD shown in FIG. 7A in a second state. FIG. 8 is an enlarged cross-sectional view showing a portion A2 shown in FIG. 7A according to some embodiments of the present disclosure. In FIGS. 6 to 8, the same reference numerals denote the same elements in FIGS. 3 to 5B, and thus, detailed descriptions of the same elements will be omitted.

Referring to FIGS. 6, 7A, 7B, and 8, the display device DD may include a display module DM displaying an image, an upper module located on the display module DM, and a lower module located under the display module DM.

The lower module may include first and second plates MP1 and MP2, a plurality of support bars MB, and a first adhesive film AF1. Descriptions on the first and second plates MP1 and MP2, the support bars MB, and the first adhesive film AF1 are omitted to avoid redundancy.

The lower module may further include a first support plate SP1 and a second support plate SP2. The number of the support plates SP1 and SP2 included in the lower module may correspond to the number of the non-folding areas NFA3 and NFA4. In a case where a plurality of folding axes AX2 is defined, the support plate SP1 and SP2 may include a plurality of support plates separated from each other with respect to the folding axes AX2. For example, when two folding axes AX2 are defined, the number of the non-folding areas may become three, and in this case, the display device DD may include three support plates.

The first and second support plates SP1 and SP2 may be arranged to respectively correspond to the first and second non-folding areas NFA3 and NFA4. The first support plate SP1 may be arranged to correspond to the first non-folding area NFA3 of the display module DM, and the second support plate SP2 may be arranged to correspond to the second non-folding area NFA4 of the display module DM. The first support plate SP1 may be arranged to overlap the first plate MP1, and the second support plate SP2 may be arranged to overlap the second plate MP2.

Each of the first and second support plates SP1 and SP2 may include a metal material. That is, each of the first and second support plates SP1 and SP2 may be a metal plate. As an example, each of the first and second support plates SP1 and SP2 may include the same material as each of the first and third support layers ML1_1 and ML2_1, respectively. In addition, each of the first and second support plates SP1 and SP2 may have a thickness greater than a thickness of each of the first and third support layers ML1_1 and ML2_1.

In the case where the display module DM is in the first state that is flat, i.e., a non-folded state, the first and second support plates SP1 and SP2 may be arranged to be spaced apart from each other in the first direction DR1. In the case where the display module DM is in the second state in which the display module DM is folded about the folding axis AX2, i.e., a folded state, the first and second support plates SP1 and SP2 may be arranged to be spaced apart from each other in the third direction DR3.

The first and second support plates SP1 and SP2 may be spaced apart from each other to correspond to the folding area FA2. The first and second support plates SP1 and SP2 may partially overlap the folding area FA2. That is, a distance d3 in the second direction DR2 between the first and second support plates SP1 and SP2 may be smaller than a width d4 of the folding area FA2.

The display device DD may further include a connection module to connect the first and second support plates SP1 and SP2. The connection module may include a hinge module or a multi-joint module.

The lower module may further include a second adhesive film AF2 located between the first and second support plates SP1 and SP2 and the first and second plates MP1 and MP2. The second adhesive film AF2 may include an upper surface facing the first and second plates MP1 and MP2 and a lower surface facing the first and second support plates SP1 and SP2. The second adhesive film AF2 may be a double-sided adhesive film. Accordingly, the first support plate SP1 may be coupled with the first plate MP1 by the second adhesive film AF2, and the second support plate SP2 may be coupled with the second plate MP2 by the second adhesive film AF2.

As an example, the second adhesive film AF2 may include a non-adhesive portion NAP formed by recessing a portion of the lower surface toward the upper surface in the folding area FA2. That is, the second adhesive film AF2 may not be adhered to the first and second support plates SP1 and SP2 in the folding area FA2 by the non-adhesive portion NAP. The second adhesive film AF2 may not be attached to the support bars MB and the first and second support plates SP1 and SP2 in the folding area FA2 by the non-adhesive portion NAP. As an example, according to some embodiments of the present disclosure, the non-adhesive portion NAP is defined as an area from which the adhesive film is partially removed, however, the present disclosure should not be limited thereto or thereby. According to some embodiments, the second adhesive film AF2 may be processed to lose its adhesion in a portion corresponding to the folding area FA2. In addition, the second adhesive film AF2 may be completely removed from the folding area FA2.

The non-adhesive portion NAP may have a width corresponding to that of the folding area FA2 in the first direction DR1 and may extend in the second direction DR2. The non-adhesive portion NAP may overlap the support bars MB when viewed in a plane.

Figure 9:
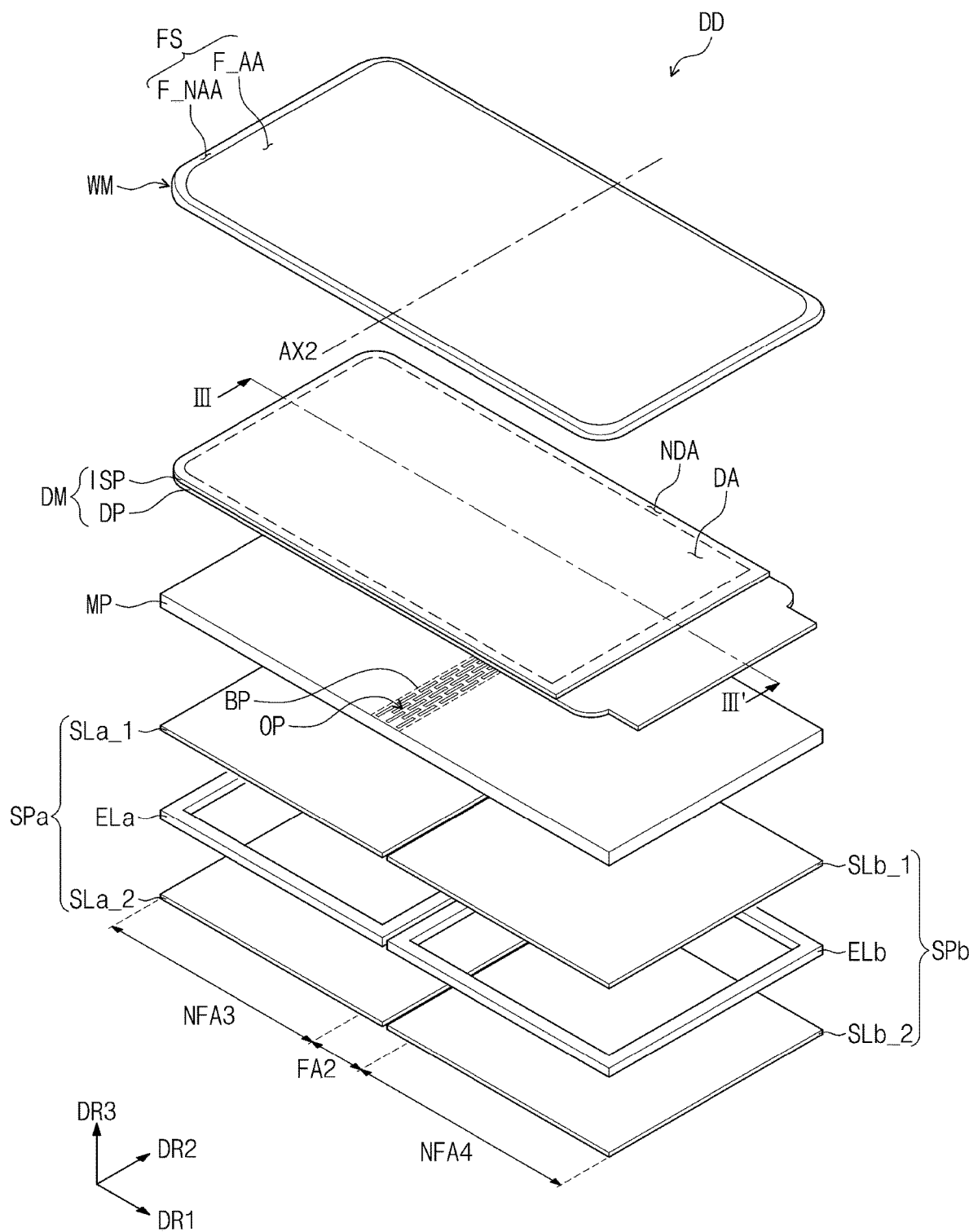
FIG. 9 is an exploded perspective view showing a display device according to some embodiments of the present disclosure.
Figure 10:
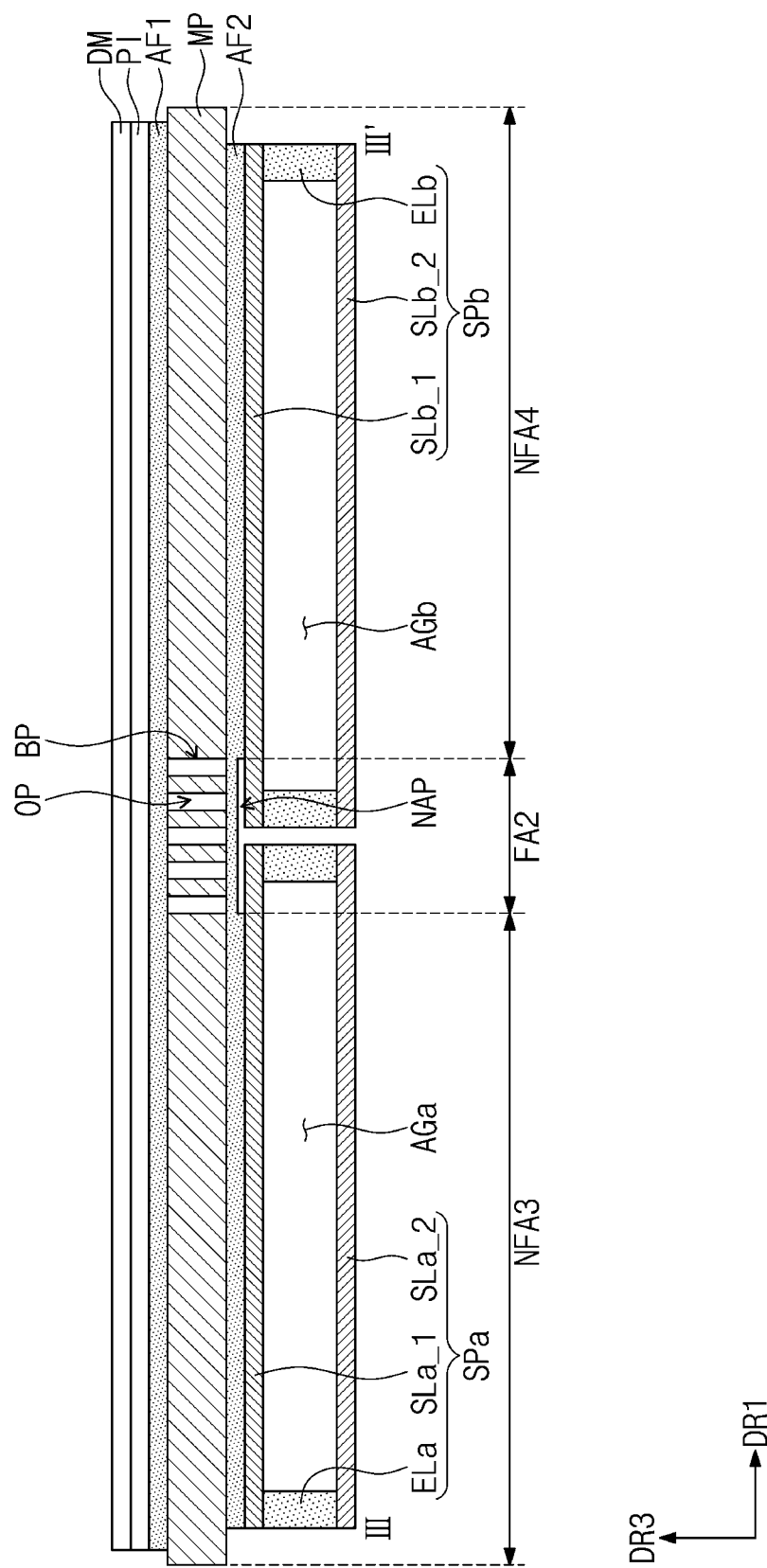
FIG. 10 is a cross-sectional view taken along a line III-III' shown in FIG. 9 according to some embodiments of the present disclosure.

FIG. 9 is an exploded perspective view showing a display device DD according to some embodiments of the present disclosure, and FIG. 10 is a cross-sectional view taken along a line III-III' shown in FIG. 9.

Referring to FIGS. 9 and 10, a lower module of the display device DD may include an upper plate MP and first and second support plates SPa and SPb.

The upper plate MP may have a plate shape entirely corresponding to a display module DM. That is, the upper plate MP may be arranged to correspond to a folding area FA2 and first and second non-folding areas NFA3 and NFA4 of the display module DM.

The upper plate MP may include a bending portion BP in which a plurality of patterns OP is defined. The bending portion BP may be provided to correspond to the folding area FA2. The patterns OP may be arranged in the bending portion BP to be spaced apart from each other by a distance (e.g., a set or predetermined distance). The patterns OP may be arranged in a zigzag shape. In addition, each of the patterns OP may be an opening pattern defined through the upper plate MP, however, the present disclosure should not be limited thereto or thereby. That is, each of the patterns OP may be a groove pattern defined by being recessed from an upper or lower surface of the upper plate MP. Each of the patterns OP may have a quadrangular shape extending in the second direction DR2 along the folding area FA2, however, the shape of the patterns OP should not be limited thereto or thereby. For example, each of the patterns OP may have a lozenge shape or a circular shape.

The bending portion BP may have improved flexibility due to the patterns OP defined in the bending portion BP. The upper plate MP may support the display module DM and may allow the display device DD to be easily folded.

Each of the patterns OP may have a quadrangular shape extending in the first direction DR1 along the folding area FA2, however, the shape of the patterns OP should not be limited thereto or thereby. For example, each of the patterns OP may have a lozenge shape or a circular shape.

The first and second support plates SPa and SPb may be arranged to respectively correspond to the first and second non-folding areas NFA3 and NFA4. The first support plate SPa may be located under the upper plate MP to correspond to the first non-folding area NFA3, and the second support plate SPb may be located under the upper plate MP to correspond to the second non-folding area NFA4.

The first support plate SPa may include a first support layer SLa_1, a second support layer SLa_2, and a first encapsulation layer ELa. Each of the first and second support layers SLa_1 and SLa_2 may include a metal material. As an example, each of the first and second support layers SLa_1 and SLa_2 may include stainless steel, aluminum, or alloys thereof. The first and second support layers SLa_1 and SLa_2 may include the same material as each other or may include different materials from each other. For example, when the first support layer SLa_1 includes aluminum, the second support layer SLa_2 may include stainless steel. As another example of the present disclosure, the first support layer SLa_1 may include a metal material, and the second support layer SLa_2 may include a plastic material.

As an example, the first and second support layers SLa_1 and SLa_2 may have the same rigidity as each other. In this case, the first and second support layers SLa_1 and SLa_2 may include the same material as each other, and the first and second support layers SLa_1 and SLa_2 may have the same thickness as each other. According to some embodiments, the first and second support layers SLa_1 and SLa_2 may have different rigidities from each other. According to some embodiments, the second support layer SLa_2 may include a material having a rigidity lower than that of the first support layer SLa_1.

Each of the first and second support layers SLa_1 and SLa_2 may have a plate shape substantially parallel to a plane defined by the first direction DR1 and the second direction DR2 crossing the first direction DR1. The first and second support layers SLa_1 and SLa_2 may be arranged to face each other in the third direction DR3. The first encapsulation layer ELa may be interposed between the first and second support layers SLa_1 and SLa_2 along an edge of the first and second support layers SLa_1 and SLa_2. The first encapsulation layer ELa may have a closed-loop shape. Accordingly, the first encapsulation layer ELa may encapsulate a first separation space AGa defined between the first and second support layers SLa_1 and SLa_2 to correspond to the first non-folding area NFA3.

The first encapsulation layer ELa may include at least one of polyethylene terephthalate (PET), polyimide (PI), polyamide (PAI), polyethylene naphthalate (PEN), or polycarbonate (PC), however, the first encapsulation layer ELa should not be limited to the above-mentioned material. According to some embodiments, the first encapsulation layer ELa may include the same material as one of the first and second support layers SLa_1 and SLa_2.

According to some embodiments, the first support plate SPa may further include a first adhesive layer and a second adhesive layer. The first adhesive layer may be located between the first encapsulation layer ELa and the first support layer SLa_1, and the second adhesive layer may be located between the first encapsulation layer ELa and the second support layer SLa_2. Each of the first and second adhesive layers may be a double-sided adhesive tape. Accordingly, the first support layer SLa_1, the first encapsulation layer Ela, and the second support layer SLa_2 may be coupled with each other by the first and second adhesive layers. According to some embodiments, the first encapsulation layer ELa may include a material having an adhesive property. In this case, the first encapsulation layer ELa may be directly coupled with each of the first and second support layers SLa_1 and SLa_2.

The first separation space AGa may be filled with air. Accordingly, an air gap may be formed between the first and second support layers SLa_1 and SLa_2. The air gap formed between the first and second support layers SLa_1 and SLa_2 may absorb an external impact applied thereto. Accordingly, the impact resistance of the display device DD may be improved.

The second support plate SPb may be arranged to be spaced apart from the first support plate SPa by a distance (e.g., a set or predetermined distance) in the first direction DR1. That is, the first support plate SPa and the second support plate SPb may be spaced apart from each other with the folding area FA2 interposed therebetween.

The second support plate SPb may include a third support layer SLb_1, a fourth support layer SLb_2, and a second encapsulation layer ELb. Each of the third and fourth support layers SLb_1 and SLb_2 may include a metal material. As an example, each of the third and fourth support layers SLb_1 and SLb_2 may include stainless steel, aluminum, or alloys thereof. The third and fourth support layers SLb_1 and SLb_2 may include the same material as each other or may include different materials from each other. When the third support layer SLb_1 includes aluminum, the fourth support layer SLb_2 may include stainless steel. As another example of the present disclosure, when the third support layer SLb_1 includes the metal material, the fourth support layer SLb_2 may include a plastic material.

As an example, the first and third support layers SLa_1 and SLb_1 may have the same rigidity as each other, and the second and fourth support layers SLa_2 and SLb_2 may have the same rigidity. In this case, the first and third support layers SLa_1 and SLb_1 may include the same material as each other, and the second and fourth support layers SLa_2 and SLb_2 may include the same material as each other.

Each of the third and fourth support layers SLb_1 and SLb_2 may have a plate shape substantially parallel to a plane defined by the first direction DR1 and the second direction DR2 crossing the first direction DR1. The third and fourth support layers SLb_1 and SLb_2 may be arranged to face each other in the third direction DR3. The second encapsulation layer ELb may be interposed between the third and fourth support layers SLb_1 and SLb_2 along an edge of the third and fourth support layers SLb_1 and SLb_2. The second encapsulation layer ELb may have a closed-loop shape. Accordingly, the second encapsulation layer ELb may encapsulate a second separation space AGb formed between the third and fourth support layers SLb_1 and SLb_2 to correspond to the second non-folding area NFA4.

The second encapsulation layer ELb may include at least one of polyethylene terephthalate (PET), polyimide (PI), polyamide (PAI), polyethylene naphthalate (PEN), or polycarbonate (PC), however, the second encapsulation layer ELb should not be limited to the above-mentioned material. According to some embodiments, the second encapsulation layer ELb may include the same material as one of the third and fourth support layers SLb_1 and SLb_2. The first and second encapsulation layers ELa and ELb may include the same material as each other and may have the same thickness as each other.

According to some embodiments, the second support plate SPb may further include a first adhesive layer and a second adhesive layer. The first adhesive layer may be arranged between the second encapsulation layer ELb and the third support layer SLb_1, and the second adhesive layer may be arranged between the second encapsulation layer ELb and the fourth support layer SLb_2. Each of the first and second adhesive layers may be a double-sided adhesive tape. Accordingly, the third support layer SLb_1, the second encapsulation layer ELb, and the fourth support layer SLb_2 may be coupled with each other by the first and second adhesive layers. According to some embodiments, the second encapsulation layer ELb may include a material having an adhesive property. In this case, the second encapsulation layer ELb may be directly coupled with the third and fourth support layers SLb_1 and SLb_2.

The second separation space AGb may be filled with air. Accordingly, an air gap may be formed between the third and fourth support layers SLb_1 and SLb_2. The air gap formed between the third and fourth support layers SLb_1 and SLb_2 may absorb the external impact applied thereto. Accordingly, the impact resistance of the display device DD may be improved. As an example, the second separation space AGb may not be filled with other materials other than air or no separate structure may be placed in the second separation space AGb.

The lower module may further include a second adhesive film AF2 located between the upper plate MP and the first and second support plates SPa and SPb. The second adhesive film AF2 may include an upper surface facing the upper plate MP and a lower surface facing the first and second support plates SPa and SPb. The second adhesive film AF2 may be a double-sided adhesive film. Accordingly, the first support layer SLa_1 of the first support plate SPa may be coupled with the upper plate MP by the second adhesive film AF2, and the third support layer SLb_1 of the second support plate SPb may be coupled with the upper plate MP by the second adhesive film AF2.

As an example, the second adhesive film AF2 may include a non-adhesive portion NAP formed by recessing a portion of the lower surface toward the upper surface in the folding area FA2. That is, the second adhesive film AF2 may not be adhered to the first and third support layers SLa_1 and SLb_1 by the non-adhesive portion NAP. As an example of the present disclosure, the non-adhesive portion NAP is defined as an area from which the adhesive film is partially removed, however, the present disclosure should not be limited thereto or thereby. According to some embodiments, the second adhesive film AF2 may be processed to lose its adhesion in a portion corresponding to the folding area FA2. In addition, the second adhesive film AF2 may be completely removed from the folding area FA2.

The non-adhesive portion NAP may have a width corresponding to that of the folding area FA2 in the first direction DR1 and may extend in the second direction DR2. The non-adhesive portion NAP may overlap the bending portion BP when viewed in a plane.

Figure 11:
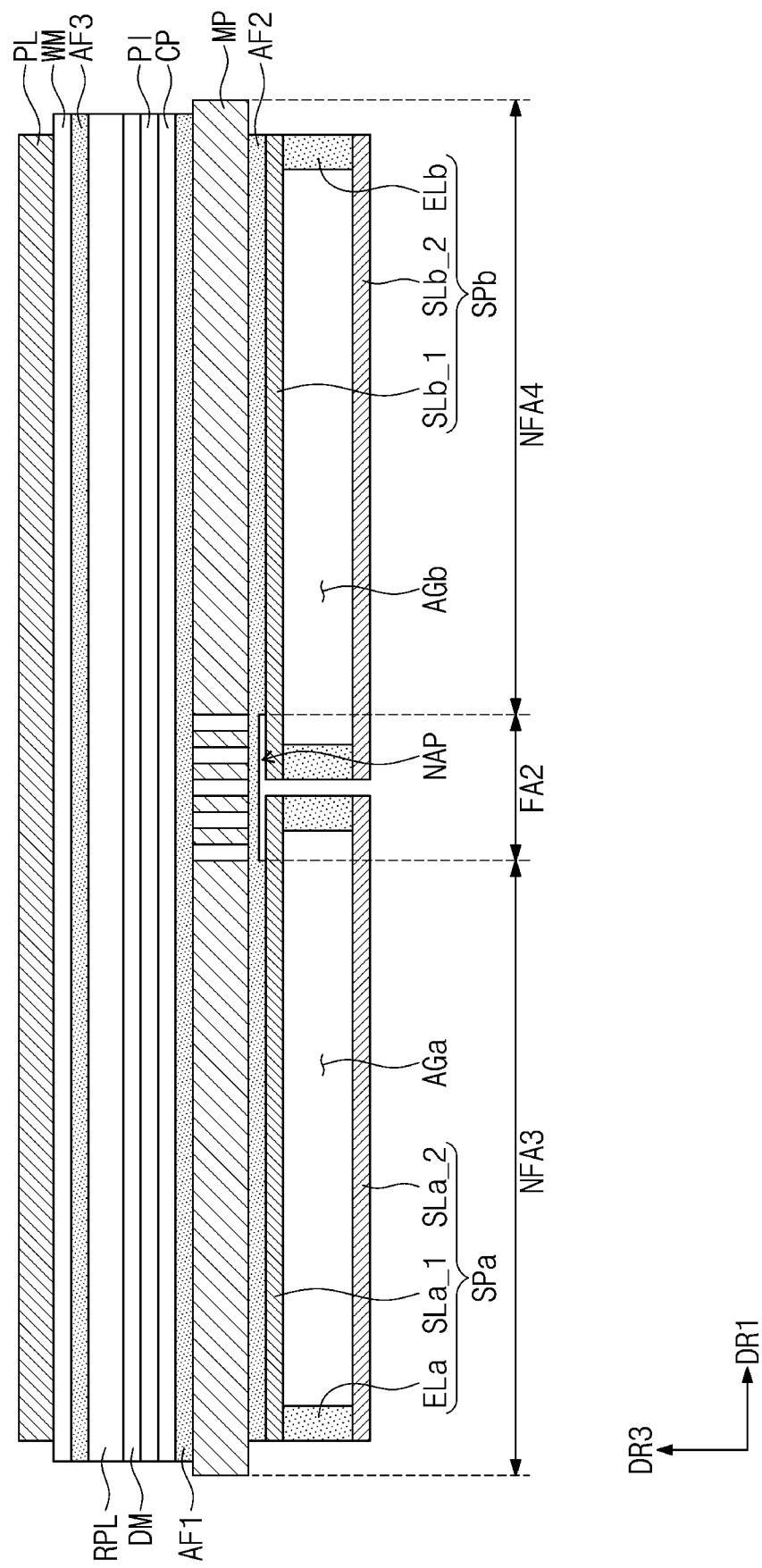
FIG. 11 is a cross-sectional view showing a display device according to some embodiments of the present disclosure.

FIG. 11 is a cross-sectional view showing a display device according to some embodiments of the present disclosure Referring to FIGS. 9 and 11, the upper module of the display device DD may include a window WM, an anti-reflective layer RPL, and a window protective layer PL.

The window WM may be arranged on the display module DM. The window WM may include an optically transparent insulating material. Accordingly, an image generated by the display module DM may be easily viewed by the user through the window WM. For example, the window WM may include a glass substrate or a synthetic resin film. When the window WM includes the glass substrate, the window WM may have a thickness equal to or smaller than about 80 micrometers, e.g., about 30 micrometers, however, the thickness of the window WM should not be limited thereto or thereby. When the window WM includes the synthetic resin film, the window WM may include a polyimide (PI)

film or a polyethylene terephthalate (PET) film. When the window WM includes the synthetic resin film, the window WM may have a thickness of about 50 micrometers.

The window WM may have a single-layer or multi-layer structure. For example, the window WM may include a plurality of synthetic resin films coupled to each other by an adhesive or the glass substrate and the synthetic resin film coupled to the glass substrate by the adhesive. The window WM may include a material having a flexible property. Thus, the window WM may be folded or unfolded about the folding axis FX2 (refer to FIG. 9). That is, the shape of the window WM may be changed when the shape of the display module DM is changed.

The window WM transmits the image from the display module DM and substantially simultaneously buffers external impacts to prevent the display module DM from being damaged or malfunctioning due to the external impacts. The external impacts indicate external force represented by pressure or stress, which causes defects in the display module DM.

The window protective layer PL may be located on the window WM. The window protective layer PL may improve an impact resistance of the window WM and may prevent the window WM from shattering when damaged. The window protective layer PL may include at least one of a urethane-based resin, an epoxy-based resin, a polyester-based resin, a polyether-based resin, an acrylate-based resin, an acrylonitrile-butadiene-styrene (ABS) resin, or a rubber. As an example, the window protective layer PL may include at least one of phenylene, polyethylene terephthalate (PET), polyimide (PI), polyamide (PA), polyethylene naphthalate (PEN), or polycarbonate (PC). The window protective layer PL may further include a hard coating material and an anti-fingerprint material.

One or more functional layers may be located between the display module DM and the window WM. As an example, the functional layer may be the anti-reflective layer RPL that reduces a reflectance of an external light incident thereto. The anti-reflective layer RPL may prevent components included in the display module DM from being perceived from the outside due to the external light incident through the front surface of the display device DD. The anti-reflective layer RPL may include a retarder and a polarizer. The retarder may be a film type or liquid crystal coating type and may include a $\lambda/2$ retarder and/or a $\lambda/4$ retarder. The polarizer may be a film type or liquid crystal coating type. The film type polarizer may include a stretching type synthetic resin film, and the liquid crystal coating type polarizer may include liquid crystals aligned in an alignment (e.g., a set or predetermined alignment). The stretching type synthetic resin film may be provided by dyeing an iodine compound on a polyvinyl alcohol film (PVA film). The retarder and the polarizer may be implemented as one polarizing film. The functional layer may further include a protective film located on or under the anti-reflective layer RPL.

The upper module may further include a third adhesive film AF3. The third adhesive film AF3 may be located between the window WM and the anti-reflective layer RPL. The third adhesive film AF3 may be a transparent adhesive layer such as a pressure sensitive adhesive film, an optically clear adhesive film, or an optically clear adhesive resin.

FIG. 11 shows a structure in which an anti-reflective layer RPL is located directly on a display module DM, however, the present disclosure should not be limited thereto or thereby. An upper module may further include a fourth adhesive film located between the anti-reflective layer RPL and the display module DM. In this case, the anti-reflective layer RPL and the display module DM may be coupled to each other by the fourth adhesive film.

Referring to FIG. 11, a lower module may further include a protective film PI and a cushion panel CP. The protective film PI and the cushion panel CP may be located between the display module DM and an upper plate MP.

The protective film PI may be located under the display module DM and may protect a rear surface of the display module DM. The protective film PI may include a synthetic resin film, e.g., a polyimide film or a polyethylene terephthalate film. However, this is merely one example, and the protective film PI should not be limited thereto or thereby.

The cushion panel CP may include a sponge, a foam, or a urethane resin. The cushion panel CP may prevent the upper plate MP from being pressed and plastic-deformed by external impact and force. That is, the cushion panel CP may improve the impact resistance of the display device DD.

As an example, the cushion panel CP may include an elastomer. For example, the cushion panel CP may include polyurethane. When the cushion panel CP includes polyurethane, the cushion panel CP may have a thickness from about 100 µm to about 150 µm.

In addition, in the case where the lower module further includes the cushion panel CP, even though the upper plate MP is deformed due to the folding operation, the deformation may not be transmitted to the display module DM. Accordingly, the deformation of patterns OP defined in the upper plate MP may be prevented from being viewed through the display module DM and may be improved.

The cushion panel CP may be coupled to the upper plate MP by a first adhesive film AF1. In addition, an adhesive film may be further located between the protective film PI and the cushion panel CP. Accordingly, the protective film PI may be attached to an upper surface of the cushion panel CP by the adhesive film.

Figure 12:
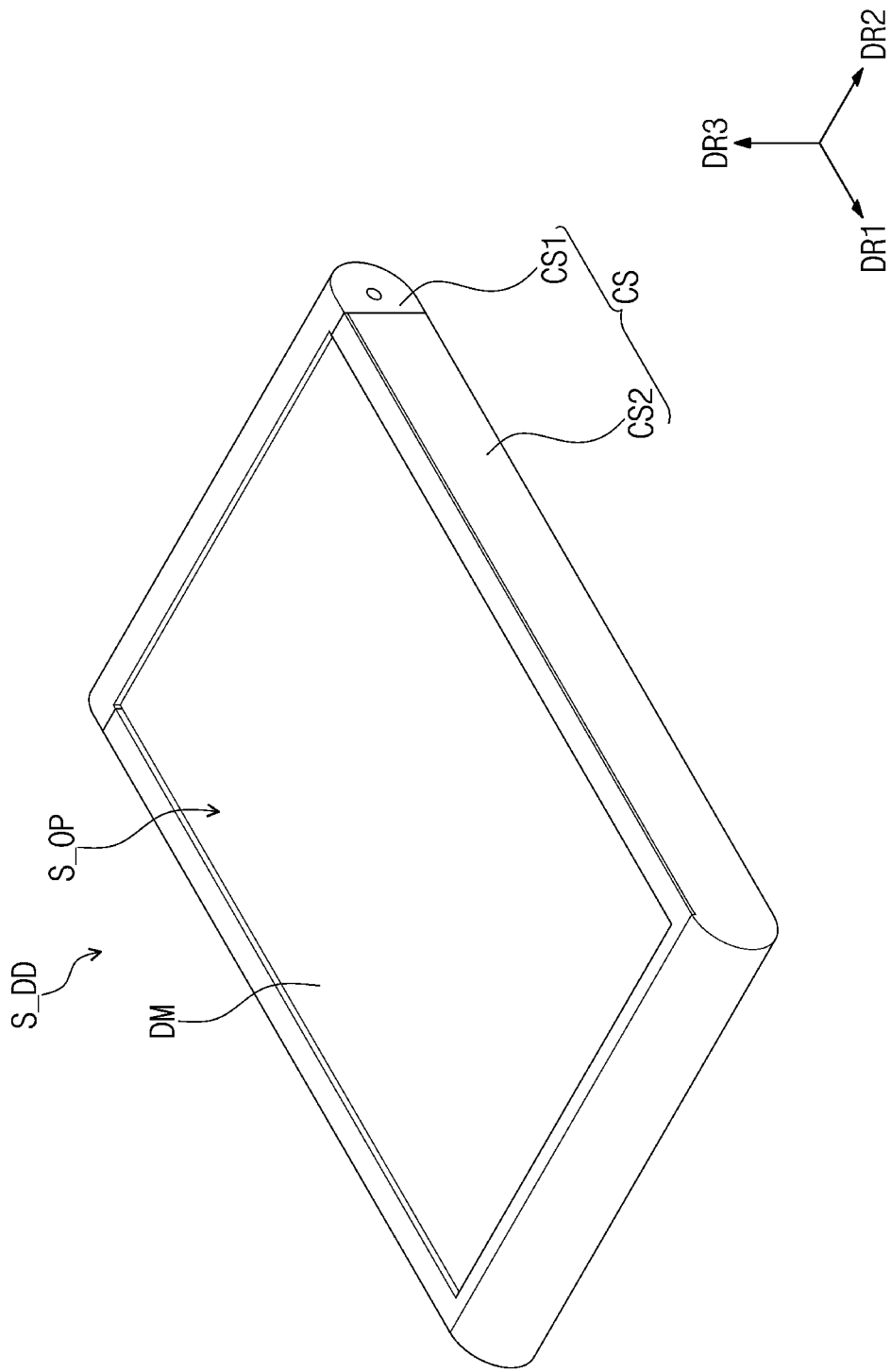
FIG. 12 is a perspective view showing a display device according to some embodiments of the present disclosure.
Figure 13:
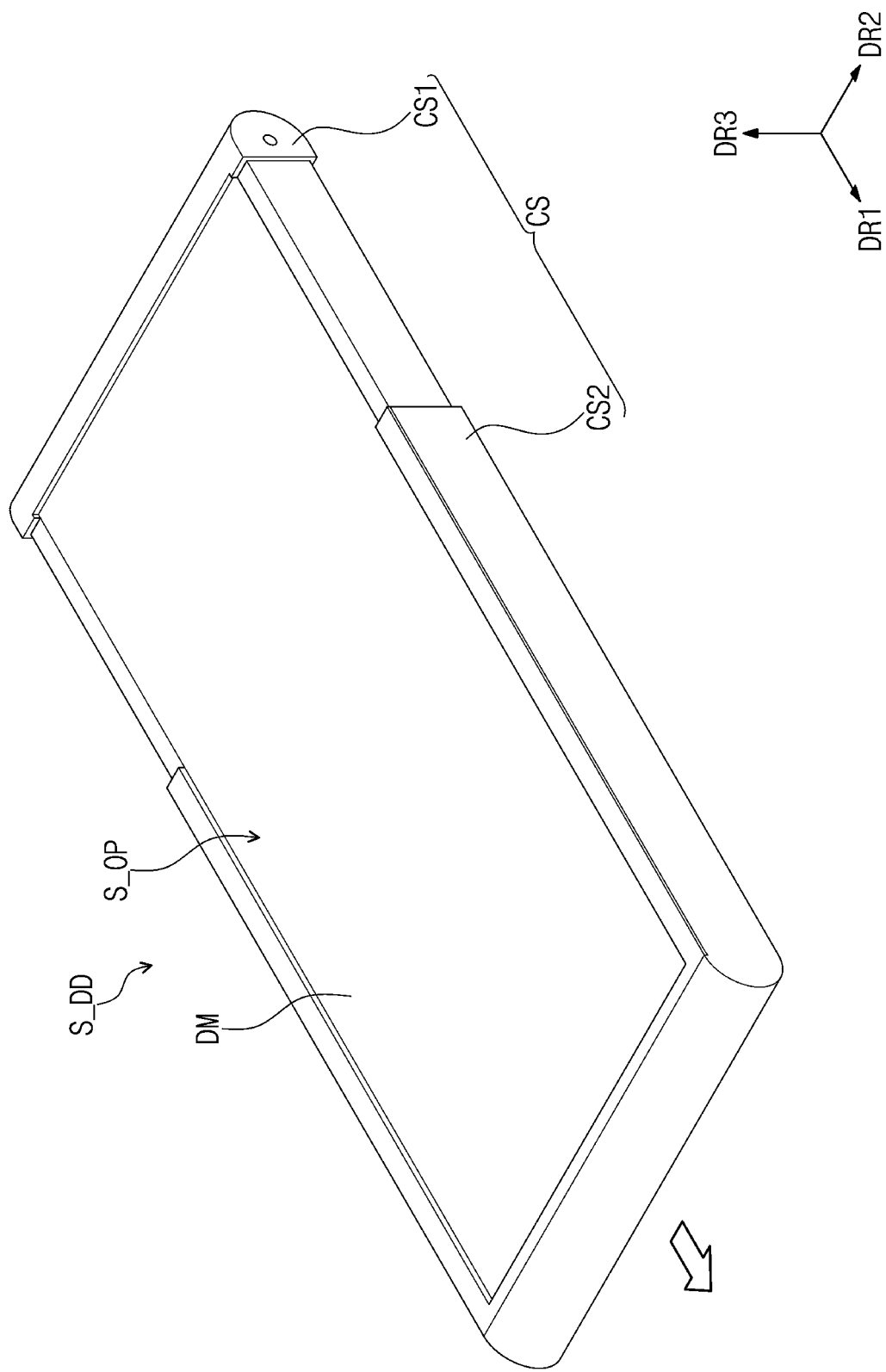
FIG. 13 is a view showing an expansion mode of the display device shown in FIG. 12 according to some embodiments of the present disclosure.

FIG. 12 is a perspective view showing a display device S_DD according to some embodiments of the present disclosure, and FIG. 13 is a view showing an expansion mode of the display device S_DD shown in FIG. 12.

Referring to FIGS. 12 and 13, the display device S_DD may include a display module DM and a case CS in which the display module DM is accommodated. The display module DM may be exposed to the outside through a display opening S_OP defined through an upper portion of the case CS.

The case CS may include a first case CS1 and a second case CS2. The first case CS1 and the second case CS2 may be coupled to each other to accommodate the display module DM. The second case CS2 may be coupled to the first case CS1 to move in a first direction DR1.

A direction crossing the first direction DR1 may be referred to as a second direction DR2. A direction substantially perpendicular to a plane defined by the first and second directions DR1 and DR2 may be referred to as a third direction DR3.

Referring to FIG. 13, an area of an exposed surface of the display module DM, i.e., an area of a display surface exposed through the display opening S_OP of the case CS, may be adjusted by the movement of the second case CS2. As an example, the display module DM may be a flexible display module and may be supported by support plate SPc, SPd, and SB located under the display module DM. The support plate SPc, SPd, and SB may be connected to the first and second cases CS1 and CS2, and when the second case CS2 moves in the first direction DR1, the support plate SPc, SPd, and SB may also move in the first direction DR1.

According to some embodiments, a portion of the display module DM that is not exposed to the outside may be located in the first case CS1 except a portion of the display module DM exposed through the display opening S_OP, i.e., the display surface DS. As the second case CS2 moves, a size of the display opening S_OP may increase in the first direction DR1. In addition, the display module DM arranged on the support plate SPc, SPd, and SB may move in the first direction DR1 together with the support plate SPc, SPd, and SB due to the movement of the second case CS2, and thus, the exposed surface of the display module DM exposed through the display opening S_OP, i.e., the display surface DS, may be expanded. Accordingly, the user may view the image through a larger screen.

As shown in FIG. 12, a state of the display device S_DD in which the display surface DS of the display module DM is set to a basic size may be defined as a basic mode. As shown in FIG. 13, a state of the display device S_DD in which the display surface DS of the display module DM is expanded may be defined as an expansion mode.

Figure 14:
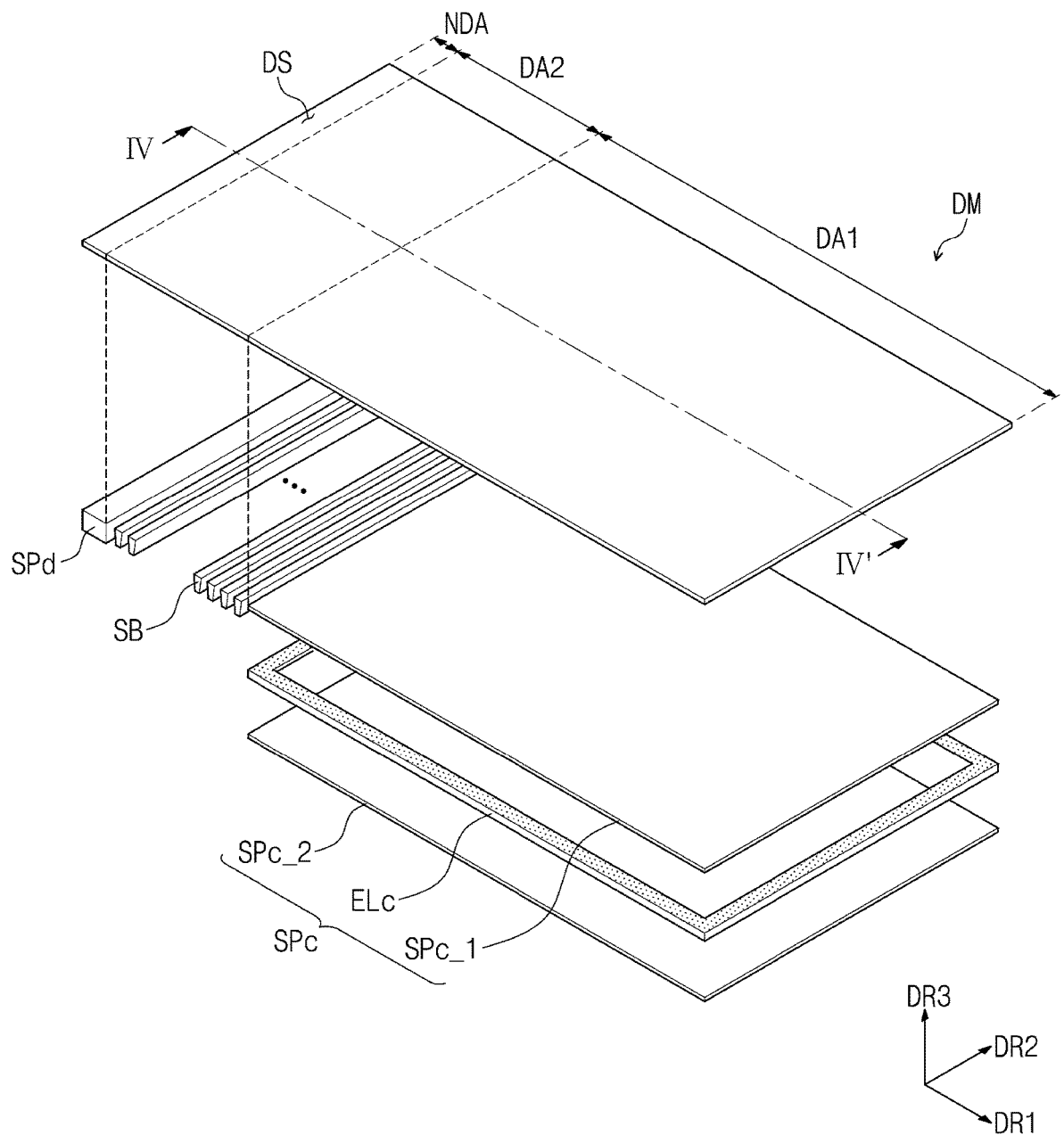
FIG. 14 is a perspective view showing a display module shown in FIG. 12 and first and second support plates supporting the display module according to some embodiments of the present disclosure.

FIG. 14 is a perspective view showing the display module DM shown in FIG. 12 and first and second support plates supporting the display module DM, and FIG. 15 is a cross-sectional view taken along a line IV-IV' shown in FIG. 14.

Referring to FIGS. 12 to 15, the display surface DS of the display module DM may include a first display area DA1, a second display area DA2, and a non-display area NDA. The first display area DA1 of the display surface DS may be provided in a size corresponding to the display opening S_OP of FIG. 12 in the basic mode to determine a screen size in the basic mode. That is, in the basic mode, the first display area DA1 of the display surface DS may be exposed through the display opening S_OP, and the second display area DA2 and the non-display area NDA may not be exposed through the display opening S_OP. According to another example, the first display area DA1 and a portion of the second display area DA2 may be exposed through the display opening S_OP in the basic mode.

The second display area DA2 may be adjacent to the first display area DA1, and when the display device S_DD is operated in the expansion mode, a portion of the second display area DA2 may be exposed through the display opening S_OP as well as the first display area DA1. That is, the screen size of the display device S_DD may increase by the exposed portion of the second display area DA2.

The non-display area NDA may be adjacent to the second display area DA2. That is, the second display area DA2 may be defined between the first display area DA1 and the non-display area NDA. The non-display area NDA may be a non-effective area that is not used as the screen of the display device S_DD.

The support plate SPc, SPd, and SB may be located under the display module DM. The support plate SPc, SPd, and SB located under the display module DM may support the display module DM. The support plate SPc, SPd, and SB may be located on a rear surface of the display module DM, which is opposite to the display surface DS. The support plate SPc, SPd, and SB may include a first support plate SPc, a second support plate SPd, and a plurality of support bars SB.

The first support plate SPc may have a plate shape substantially parallel to a plane defined by the first and second directions DR1 and DR2. The first support plate SPc may be provided in a size corresponding to the first display area DA1 of the display module DM. The first support plate SPc may be located on the rear surface opposite to the display surface DS of the display module DM and may support the first display area DA1 of the display module DM. The second support plate SPd may extend in the second direction DR2. The second support plate SPd may have a rectangular shape defined by long sides extending in the second direction DR2 and short sides extending in the first direction DR1. The second support plate SPd may be provided in a size corresponding to the non-display area NDA of the display module DM. The support bars SB and the second support plate SPd may be located on the rear surface of the display module DM and may support the second display area DA2 and the non-display area NDA, respectively.

In the basic mode, the display module DM of the second display area DA2 may be located on the rear surface of the first support plate SPc. That is, the first display area DA1 may be defined as a non-bending area, and all or a portion of the second display area DA2 may be defined as a bending area. The first support plate SPc may be arranged to correspond to the non-bending area, and the support bars SB may be arranged to correspond to the bending area.

The first support plate SPc may include a first support layer SPc_1, a second support layer SPc_2, and an encapsulation layer ELc. Each of the first and second support layers SPc_1 and SPc_2 may include a metal material. As an example, each of the first and second support layers SPc_1 and SPc_2 may include stainless steel, aluminum, or alloys thereof. The first and second support layers SPc_1 and SPc_2 may include the same material as each other or may include different materials from each other. For example, when the first support layer SPc_1 includes aluminum, the second support layer SPc_2 may include the stainless steel. As an example of the present disclosure, the first support layer SPc_1 may include a metal material, and the second support layer SPc_2 may include a plastic material.

As an example, the first and second support layer SPc_1 and SPc_2 may have the same rigidity as each other. In this case, the first and second support layers SPc_1 and SPc_2 may include the same material as each other, and the first and second support layers SPc_1 and SPc_2 may have the same thickness as each other. According to some embodiments, the first and second support layers SPc_1 and SPc_2 may have different rigidities from each other. According to some embodiments, the second support layer SPc_2 may include a material having the rigidity lower than that of the first support layer SPc_1.

Each of the first and second support layers SPc_1 and SPc_2 may have a plate shape substantially parallel to a plane define by the first direction DR1 and the second direction DR2 crossing the first direction DR1. The first and second support layers SPc_1 and SPc_2 may be arranged to face each other in the third direction DR3. The encapsulation layer ELc may be interposed between the first and second support layers SPc_1 and SPc_2 along an edge of the first and second support layers SPc_1 and SPc_2. The encapsulation layer ELc may have a closed-loop shape. Accordingly, the encapsulation layer ELc may encapsulate a separation space AGc formed between the first and second support layers SPc_1 and SPc_2 to correspond to the first display area DA1.

The encapsulation layer ELc may include at least one of polyethylene terephthalate (PET), polyimide (PI), polyamide (PAI), polyethylene naphthalate (PEN), or polycarbonate (PC), however, the encapsulation layer ELc should not be limited to the above-mentioned material. According to some embodiments, the encapsulation layer ELc may include the same material as one of the first and second support layers SPc_1 and SPc_2.

According to some embodiments, the first support plate SPc may further include a first adhesive layer and a second adhesive layer. The first adhesive layer may be located between the encapsulation layer ELc and the first support layer SPc_1, and the second adhesive layer may be located between the encapsulation layer ELc and the second support layer SPc_2. Each of the first and second adhesive layers may be a double-sided adhesive tape. Accordingly, the first support layer SPc_1, the encapsulation layer ELc, and the second support layer SPc_2 may be coupled to each other by the first and second adhesive layers. According to some embodiments, the encapsulation layer ELc may include a material having an adhesive property. In this case, the encapsulation layer ELc may be directly coupled to each of the first and second support layers SPc_1 and SPc_2.

The separation space AGc may be filled with air. Accordingly, an air gap may be formed between the first and second support layers SPc_1 and SPc_2. The air gap formed between the first and second support layers SPc_1 and SPc_2 may absorb the external impacts applied thereto. Accordingly, the impact resistance of the display device DD may be improved. As an example, the separation space AGc may not be filled with other materials other than air or no separate structure may be placed in the separation space AGc. That is, the separation space AGc may be filled with only the air.

The support bars SB may be located between the first support plate SPc and the second support plate SPd. The support bars SB may extend in the second direction DR2 and may be arranged in the first direction DR1. The support bars SB may be spaced apart from each other in the first direction DR1. When viewed in the second direction DR2, each of the support bars SB may have an inverted trapezoid shape with respect to the display surface DS of the display module DM.

As an example, the support bars SB spaced apart from each other in the first direction DR1 are shown, however, the structure of the support bars SB should not be limited thereto or thereby. For example, the support bars SB may also be implemented as joint structures that are combined to rotate with each other.

According to some embodiments, an adhesive is located between the display module DM and the support plates SPc and SPd and between the display module DM and the support bars SB, and thus, the support plates SPc and SPd and the support bars SB may be attached to the rear surface of the display module DM. As an example, the adhesive may include a pressure sensitive adhesive, however, the adhesive should not be limited thereto or thereby and may include a variety of adhesives.

Although aspects of some embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any embodiments described herein, and the scope of embodiments according to the inventive concepts shall be determined according to the attached claims, and their equivalents.

What is claimed is:

1. A display device comprising:
    a display module comprising a first non-folding area, a second non-folding area, and a folding area between the first non-folding area and the second non-folding area;
    a first plate under the display module at the first non-folding area; and
    a second plate under the display module at the second non-folding area and spaced apart from the first plate, at least one of the first or second plates comprising:
    a first support layer;
    a second support layer facing the first support layer; and
    an encapsulation layer between a rear surface of the first support layer and a front surface of the second support layer, which are parallel to each other, along an edge of the first and second support layers and encapsulating a separation space formed between the rear surface of the first support layer and the front surface of the second support layer in a corresponding non-folding area of the first and second non-folding areas.

2. The display device of claim 1, wherein the encapsulation layer has a closed-loop shape, and the separation space is filled with an air.

3. The display device of claim 1, wherein each of the first support layer and the second support layer is parallel to a plane defined by a first direction and a second direction crossing the first direction, and the first and second support layers face each other in a third direction perpendicular to the plane.

4. The display device of claim 3, further comprising a plurality of support bars between the first plate and the second plate, and the support bars are spaced apart from each other in the first direction or the second direction.

5. The display device of claim 4, wherein a thickness in the third direction of each of the first and second support layers is smaller than a thickness in the third direction of each of the support bars.

6. The display device of claim 3, wherein a thickness in the third direction of the first support layer is greater than a thickness in the third direction of the second support layer.

7. The display device of claim 1, wherein the first plate and the second plate are spaced apart from each other at an area corresponding to the folding area.

8. The display device of claim 1, wherein the first support layer comprises a same material as the second support layer.

9. The display device of claim 1, wherein each of the first and second support layers comprises a metal material.

10. The display device of claim 1, wherein the first support layer comprises a material different from the second support layer.

11. The display device of claim 10, wherein the first support layer comprises a metal material, and the second support layer comprises a plastic material.

12. The display device of claim 1, wherein at least one of the first or second plates comprises:
    a first adhesive layer between the first encapsulation layer and the first support layer; and
    a second adhesive layer between the first encapsulation layer and the second support layer.

13. The display device of claim 1, further comprising:
    a first support plate under the first plate; and
    a second support plate under the second plate, wherein the first and second support plates are spaced apart from each other at the folding area.

14. A display device comprising:
a display module comprising a first non-folding area, a second non-folding area, and a folding area between the first non-folding area and the second non-folding area;
an upper plate comprising a bending portion overlapping the folding area;
a first support plate under the upper plate to correspond to the first non-folding area; and
a second support plate under the upper plate to correspond to the second non-folding area and spaced apart from the first support plate, at least one of the first or second support plates comprising:
a first support layer;
a second support layer facing the first support layer; and
an encapsulation layer between a rear surface of the first support layer and a front surface of the second support layer, which are parallel to each other, along an edge of the first and second support layers and encapsulating a separation space formed between the rear surface of the first support layer and the front surface of the second support layer in a corresponding non-folding area of the first and second non-folding areas.

15. The display device of claim 14, wherein the encapsulation layer has a closed-loop shape, and the separation space is filled with an air.

16. The display device of claim 14, wherein each of the first support layer and the second support layer is parallel to a plane defined by a first direction and a second direction crossing the first direction, and the first and second support layers face each other in a third direction perpendicular to the plane.

17. The display device of claim 16, wherein a thickness in the third direction of the first support layer is equal to or different from a thickness in the third direction of the second support layer.

18. A display device comprising:
a display module having a bending area, and a non-bending area; and
a support plate under the display module, the support plate comprising:
a first support layer at the non-bending area;
a second support layer facing the first support layer; and
an encapsulation layer between a rear surface of the first support layer and a front surface of the second support layer, which are parallel to each other, along an edge of the first and second support layers and encapsulating a separation space between the rear surface of the first support layer and the front surface of the second support layer in the non-bending area.

19. The display device of claim 18, wherein the encapsulation layer has a closed-loop shape, and the separation space is filled with air.

20. The display device of claim 18, wherein each of the first support layer and the second support layer is parallel to a plane defined by a first direction and a second direction crossing the first direction, and the first and second support layers face each other in a third direction perpendicular to the plane.

21. The display device of claim 20, further comprising a plurality of support bars under the display module at the bending area, wherein the support bars are spaced apart from each other in the first direction or the second direction.

22. The display device of claim 21, wherein a thickness in the third direction of each of the first and second support layers is smaller than a thickness in the third direction of each of the support bars.

23. The display device of claim 20, wherein a thickness in the third direction of the first support layer is greater than a thickness in the third direction of the second support layer.

24. The display device of claim 18, wherein the first support layer comprises a same material as the second support layer.

25. The display device of claim 24, wherein each of the first and second support layers comprises a metal material.

26. The display device of claim 18, wherein the first support layer comprises a material different from the second support layer.

27. The display device of claim 26, wherein the first support layer comprises a metal material, and the second support layer comprises a plastic material.

28. The display device of claim 18, wherein the encapsulation layer comprises an adhesive material.

* * * * *